United States Patent
Nishihara et al.

(10) Patent No.: US 7,682,677 B2
(45) Date of Patent: Mar. 23, 2010

(54) INFORMATION RECORDING MEDIUM AND METHOD FOR MANUFACTURING THE SAME

(75) Inventors: Takashi Nishihara, Osaka (JP); Akio Tsuchino, Osaka (JP); Rie Kojima, Osaka (JP); Noboru Yamada, Osaka (JP)

(73) Assignee: Panasonic Corporation, Osaka (JP)

( * ) Notice: Subject to any disclaimer, the term of this patent is extended or adjusted under 35 U.S.C. 154(b) by 709 days.

(21) Appl. No.: 10/587,250

(22) PCT Filed: Sep. 6, 2005

(86) PCT No.: PCT/JP2005/016324

§ 371 (c)(1), (2), (4) Date: Jul. 26, 2006

(87) PCT Pub. No.: WO2006/051645

PCT Pub. Date: May 18, 2006

(65) Prior Publication Data
US 2007/0154673 A1    Jul. 5, 2007

(30) Foreign Application Priority Data
Nov. 10, 2004    (JP) .............................. 2004-326182

(51) Int. Cl.
*B32B 3/02* (2006.01)
(52) U.S. Cl. .................... 428/64.4; 428/64.5; 428/64.6; 430/270.13
(58) Field of Classification Search ............... 428/64.4, 428/64.5, 64.6; 430/270.13
See application file for complete search history.

(56) References Cited

U.S. PATENT DOCUMENTS

| 5,334,433 | A | * | 8/1994 | Tominaga ................. 428/64.5 |
| 6,071,587 | A | * | 6/2000 | Yoshinari et al. ........... 428/64.1 |
| 6,153,063 | A | | 11/2000 | Yamada et al. |
| 6,416,837 | B1 | * | 7/2002 | Kojima et al. .............. 428/64.1 |
| 6,456,584 | B1 | | 9/2002 | Nagata et al. |
| 6,503,690 | B1 | | 1/2003 | Uno et al. |
| 6,670,014 | B2 | | 12/2003 | Nishihara et al. |
| 6,743,496 | B2 | | 6/2004 | Nishihara et al. |
| 6,794,006 | B2 | | 9/2004 | Nishihara et al. |
| 6,821,707 | B2 | | 11/2004 | Uno et al. |

(Continued)

FOREIGN PATENT DOCUMENTS

CN    1538421    10/2004

(Continued)

OTHER PUBLICATIONS

Office Action issued May 8, 2009 in corresponding Chinese Application No. 200580005490.3 with English translation.

*Primary Examiner*—Elizabeth Mulvaney
(74) *Attorney, Agent, or Firm*—Wenderoth, Lind & Ponack, L.L.P.

(57) ABSTRACT

An information recording medium with high recording sensitivity and superior repeat overwriting capability. The information recording medium (15) comprising at least recording layer (104) recording and/or reproducing information through irradiation with a laser beam or application of an electric current, and second dielectric layer (106) on substrate (14), wherein the second dielectric layer (106) comprises M1 (provided that M1 is at least one element selected from Sc, Y, La, Gd, Dy and Yb) and O.

32 Claims, 11 Drawing Sheets

U.S. PATENT DOCUMENTS

| | | |
|---|---|---|
| 6,881,466 B2 * | 4/2005 | Kojima et al. ............... 428/64.1 |
| 6,890,613 B2 | 5/2005 | Nishihara et al. |
| 7,074,471 B2 | 7/2006 | Kitaura et al. |
| 2003/0190447 A1 * | 10/2003 | Kojima et al. ............... 428/64.1 |
| 2004/0047281 A1 | 3/2004 | Nishihara et al. |
| 2004/0048029 A1 | 3/2004 | Nishihara et al. |
| 2004/0115559 A1 | 6/2004 | Kato et al. |
| 2004/0191683 A1 | 9/2004 | Nishihara et al. |
| 2004/0191686 A1 | 9/2004 | Kitaura et al. |
| 2004/0202895 A1 | 10/2004 | Inoue et al. |
| 2005/0019695 A1 * | 1/2005 | Kojima et al. ........... 430/270.13 |
| 2005/0089799 A1 | 4/2005 | Otoba et al. |

FOREIGN PATENT DOCUMENTS

| | | |
|---|---|---|
| EP | 0 825 595 | 2/1998 |
| EP | 0 897 177 | 2/1999 |
| EP | 0 957 477 | 11/1999 |
| EP | 1 187 119 | 3/2002 |
| JP | 10-275360 | 10/1998 |
| JP | 11-339314 | 12/1999 |
| JP | 2000-36130 | 2/2000 |
| JP | 2002-144736 | 5/2002 |
| JP | 2003-341241 | 12/2003 |
| JP | 2004-5767 | 1/2004 |
| JP | 2004-164850 | 6/2004 |
| JP | 2004-206851 | 7/2004 |
| JP | 2004-273040 | 9/2004 |
| JP | 2004-310992 | 11/2004 |
| JP | 2004-311011 | 11/2004 |
| WO | 03/044788 | 5/2003 |

* cited by examiner

INFORMATION RECORDING MEDIUM AND METHOD FOR MANUFACTURING THE SAME

TECHNICAL FIELD

The present invention relates to an information recording medium wherein information is recorded, erased, overwritten and/or reproduced optically or electronically, and a manufacturing method for the same.

BACKGROUND ART

In conventional information recording media, the information layer (phase-change material layer) is a phase-change information recording medium that utilizes the phenomenon in which a phase-change between a crystalline phase and an amorphous phase is produced. Among these phase-change information recording media, one in which information is recorded, erased, overwritten and/or reproduced optically by using a laser beam is an optical phase-change information recording medium. In an optical phase-change information recording medium, a change of state between a crystalline phase and an amorphous phase in the phase-change material of the recording layer is produced as a result of heat generated by irradiation with a laser beam, and the difference in reflectance between the crystalline phase and amorphous phase is detected and is read out as information. Among optical phase-change information recording media, in a overwritable optical phase-change information recording medium in which information can be erased and overwritten, the initial state of the recording layer is generally a crystalline phase, and when information is recorded, the recording layer that is irradiated with a high power (recording power) laser beam melts and then rapidly cools, so that the laser-irradiated portion becomes amorphous. On the contrary, when information is erased, the recording layer that is irradiated with a laser beam with a power that is lower than that during recording (erasing power) is warmed and cooled, so that the laser-irradiated portion becomes crystalline. Consequently, in a rewritable optical phase-change information recording medium, by irradiating the recording layer with a laser beam for which the power can be modulated between a high power and a low power, it is possible for new information to be recorded or overwritten while recorded information is being erased. Moreover, among optical phase-change information recording media, for write-once optical phase-change information recording media in which it is possible for information to be recorded one time but not possible for information to be erased or overwritten, the initial state of the recording layer is generally an amorphous phase, and the laser-irradiated portion becomes crystalline as the recording layer warms up and cools while being irradiated with a high power (recording power) laser beam when information is recorded.

Instead of the abovementioned irradiation with a laser beam, there are also electrical phase-change information recording media that record information by causing a state change in the phase-change material of the recording layer by means of Joule heating generated by the application of electrical energy (for example electrical current). In these electrical phase-change information recording media, the phase-change material of the recording layer undergoes a state change between a crystalline phase (low resistance) and an amorphous phase (high resistance) by means of Joule heating generated by the application of electrical current, and the difference in electrical resistance between the crystalline phase and amorphous phase is detected and is reproduced as information.

The commercial 4.7 GB/DVD-RAM is given by the present inventors as an example of an optical phase-change information recording medium. As shown in FIG. 12 for information recording medium 12, the GB/DVD-RAM has a 7-layer configuration, where first dielectric layer 2, first interface layer 3, recording layer 4, second interface layer 5, second dielectric layer 6, light absorption correction layer 7, and reflection layer 8 are provided over substrate 1 in order from the laser incident side.

First dielectric layer 2 and second dielectric layer 6 adjust the optical path and enhance the light absorption efficiency of recording layer 4, so that optical action increases the magnitude of the signal strength as the change in reflectance between the crystalline phase and the amorphous phase grows larger, and serve a thermal function to insulate the heat-sensitive substrate 1 and dummy substrate 10 and so forth from the heat due to the higher temperature of recording layer 4 during recording. In use now more than previously, $(ZnS)_{80}(SiO_2)_{20}$ (mol %) is a superior dielectric material that has transparency and a high refractive index, and is also a good insulator with low thermal conductivity, favorable mechanical characteristics and resistance to humidity. Furthermore, the layer thicknesses of first dielectric layer 2 and second dielectric layer 6 can be determined exactly according to a calculation based on the matrix method, so as to satisfy conditions that increase the change in the amount of reflected light between the crystalline phase and amorphous phase of recording layer 4, and increase the light absorption in recording layer 4.

By using a high crystallization speed material in recording layer 4 that includes (Ge—Sn)Te—$Sb_2Te_3$ wherein Sn substitutes for a portion of the Ge in the pseudo-binary phase-change material GeTe—$Sb_2Te_3$ that combines the compounds GeTe and $Sb_2Te_3$, not only is there efficient overwriting of the initial recording, but superior recording shelf life (the indicator of whether the recorded signal can be recovered after long-term storage) and overwriting shelf-life (the indicator of whether the recorded signal can be erased or overwritten after long-term storage) are also realized.

First interface layer 3 and second interface layer 5 function to prevent mass transfer from taking place between first dielectric layer 2 and recording layer 4, and between second dielectric layer 6 and recording layer 4. In this mass transfer phenomenon, when $(ZnS)_{80}(SiO_2)_{20}$ (mol %) is used in first dielectric layer 2 and second dielectric layer 6, S (sulfur) diffuses into the recording layer during the time when recording layer 4 is irradiated with a laser beam for repeated recording and overwriting. When S diffuses into the recording layer, the repeat overwriting capability deteriorates. The use of Ge-containing nitrides in first interface layer 3 and second interface layer 5 favors the avoidance of this deterioration of the repeat overwriting capability (for example, see Patent Document 1).

Through the use of technology such as that described above, superior overwriting performance and high reliability were achieved and the 4.7 GB/D VD-RAM was brought to commercialization.

Moreover, various kinds of technology have been studied in order to obtain information recording media with higher capacity. In the example of optical phase-change information recording media, a high density recording technique with a smaller laser beam spot diameter was investigated by using a violet-blue laser with a shorter wavelength than that of the conventional red laser, and by using a thinner substrate on the laser beam-incident side and an objective lens with a larger numerical aperture (NA). When recording is carried out with a smaller spot diameter, since the laser beam irradiation can be limited to a smaller region, the volume change will be greater with an increased power density being absorbed by the recording layer. Consequently, it becomes easier for mass transfer to occur, and when S-containing materials such as ZnS—SiO$_2$ are used in the vicinity of the recording layer, the repeat overwriting capability will deteriorate.

In addition, the information capacity increases two-fold by using an optical phase-change information recording medium that is provided with two information layers (referred to below as a bilayer optical phase-change information recording medium), and the technique of carrying out record/reproduce operations on the two information layers by using an incident laser beam from one side has also been investigated (for example see Patent Documents 2 and 3). In these bilayer optical phase-change information recording media, laser beam that is used will pass through the information layer proximal to the laser beam incident side (referred to as the first information layer) in order to perform record/reproduce operations on the information layer distal to the laser beam incident side (referred to below as the second information layer), so the first information layer should have an extremely thin film thickness and high permeability. However, because the effect of mass transfer from a layer in the vicinity of the recording layer becomes more significant as that recording layer becomes thinner, there will be a marked deterioration in the repeat overwriting capability when using S-containing materials such as ZnS—SiO$_2$ in the vicinity of the recording layer.

Heretofore, in cases such as that described above, inventors have introduced Ge-containing nitrides in interface layers on both sides of the information layer in substantially the same manner as with the 4.7 GB/DVD-RAM, so that the effect of mass transfer was mitigated and the deterioration of the repeat overwriting capability was avoided.

Nevertheless, when carrying out high density recording operations with a smaller laser beam spot diameter in optical phase-change information recording media, the recording layer is irradiated with a higher energy (laser power) when information is recorded. For this reason, when conventional Ge-containing nitrides are used in the interface layer, the heat generated in the recording layer gives rise to film disruption in that interface layer, and there is a problem with marked deterioration of the repeat overwriting capability due to the interface layer becoming unable to control the diffusion of S from the accompanying dielectric layer.

Moreover, since Ge-containing nitrides have high thermal conductivity, if a thicker interface layer is constructed in order to control the diffusion of S from the dielectric layer, the heat will facilitate the diffusion. As a result, there will be a problem with reduced recording sensitivity.

Patent Document 1: Japanese published unexamined patent application No. H10-275360 (pp. 2-6, FIG. 2) (1998)

Patent Document 2: Japanese published unexamined patent application No. 2000-36130 (pp. 2-11, FIG. 2)

Patent Document 3: Japanese published unexamined patent application No. 2002-144736 (pp. 2-14, FIG. 3)

INVENTION DISCLOSURE

An object of the present invention is to solve the above-mentioned conventional problem, and to provide a phase-change information recording medium with both high recording sensitivity and superior repeat overwriting capability.

In order to solve the above-mentioned conventional problem, an information recording medium of the present invention is a medium comprising at least a recording layer that records and/or reproduces information through irradiation with a laser beam or application of an electric current, and with a dielectric layer, wherein the dielectric layer comprises M1 (provided that M1 is at least one element selected from Sc, Y, La, Gd, Dy and Yb) and O.

Therefore, recording sensitivity and repeat overwriting capability of the phase-change information recording medium can be improved.

An medium for recording information information recording medium comprising at least two information layers, wherein at least one information layer comprises at least a recording layer that records and/or reproduces information through irradiation with a laser beam or application of an electric current, and a dielectric layer, wherein the dielectric layer comprises M1 and O.

Therefore, in a phase-change information recording medium, an information recording layer with high recording sensitivity and superior repeat overwriting capability can be obtained.

The dielectric layer may further comprise M2 (provided that M2 is at least one element selected from Zr, Hf and Si).

Therefore, repeat overwriting capability of the phase-change information recording medium can be further improved.

The dielectric layer may further comprise M3 (provided that M3 is at least one element selected from Al, Ga, Mg, Zn, Ta, Ti, Ce, In, Sn, Te, Nb, Cr, Bi, Al, Ge, N and C).

Therefore, recording sensitivity and repeat overwriting capability of the phase-change information recording medium can be improved.

The dielectric layer may be represented by the composition formula $M1_aM2_bO_{100-a-b}$ (provided that $10<a<40$ and $0<b<25$ (atom %)).

Therefore, repeat overwriting capability of the phase-change information recording medium can be improved.

The dielectric layer may be represented by the composition formula $M1_cM3_dO_{100-c-d}$ (provided that $5<c<45$, $0<d<85$ and $25<c+d<95$ (atom %)).

Therefore, recording sensitivity and repeat overwriting capability of the phase-change information recording medium can be improved.

The dielectric layer may be represented by the composition formula $M1_eM2_fM3_gO_{100-e-f-g}$ (provided that $5<e<40$, $0<f<25$, $0<g<85$ and $25<e+f+g<95$ (atom %)).

Therefore, recording sensitivity and repeat overwriting capability of the phase-change information recording medium can be improved.

The dielectric layer may comprise $M1_2O_3$.

Therefore, recording sensitivity and repeat overwriting capability of the phase-change information recording medium can be improved.

The dielectric layer may be represented by $M1_2O_3$-$M2O_2$.

Therefore, repeat overwriting capability of the phase-change information recording medium can be further improved.

The dielectric layer may further comprise D (provided that D is at least one compound selected from $Al_2O_3$, $Ga_2O_3$, MgO, ZnO, $Ta_2O_5$, $TiO_2$, $CeO_2$, $In_2O_3$, $SnO_2$, $TeO_2$, $Nb_2O_5$, $Cr_2O_3$, $Bi_2O_3$, AlN, Cr—N, Ge—N, $Si_3N_4$ and SiC).

Therefore, recording sensitivity and repeat overwriting capability of the phase-change information recording medium can be improved.

The dielectric layer may be represented by the composition formula $(M1_2O_3)_x(M2O_2)_{100-x}$ (provided that $20 \leq x \leq 95$ (mol %)).

Therefore, repeat overwriting capability of the phase-change information recording medium can be further improved.

The dielectric layer may be represented by the composition formula $(M1_2O_3)_y(D)_{100-y}$ (provided that $20 \leq y \leq 95$ (mol %)).

Therefore, recording sensitivity and repeat overwriting capability of the phase-change information recording medium can be improved.

The dielectric layer may be represented by the compositional formula $(M1_2O_3)_z(M2O_2)_w(D)_{100-z-w}$ (provided that $20 \leq z \leq 90$, $5 \leq w \leq 75$ and $25 \leq z+w \leq 95$ (mol %)).

Therefore, recording sensitivity and repeat overwriting capability of the phase-change information recording medium can be improved.

The recording layer of the information recording medium of the present invention goes through a phase-change between a crystalline phase and an amorphous phase.

The recording layer may comprise Ge and Te and at least one element selected from Sb, Bi, In and Sn.

Also, the recording layer is represented by any of (Ge—Sn)Te, GeTe—$Sb_2Te_3$, (Ge—Sn)Te—$Sb_2Te_3$, GeTe—$Bi_2Te_3$, (Ge—Sn)Te—$Bi_2Te_3$, GeTe—(Sb—Bi)$_2$Te$_3$, (Ge—Sn)Te—(Sb—Bi)$_2$Te$_3$, GeTe—(Bi—In)$_2$Te$_3$ and (Ge—Sn)Te—(Bi—In)$_2$Te$_3$.

Therefore, repeat overwriting capability of the phase-change information recording medium can be improved.

In the information recording medium of the present invention, the medium further comprises an interface layer between the dielectric layer and the recording layer.

Therefore, repeat overwriting capability of the phase-change information recording medium can be improved.

The interface layer may comprise O, and at least one element selected from Zr, Hf, Y and Si, and at least one element selected from Ga, In and Cr.

Therefore, repeat overwriting capability of the phase-change information recording medium can be further improved.

The interface layer comprises at least one oxide selected from $ZrO_2$, $HfO_2$, $Y_2O_3$ and $SiO_2$, and at least one oxide selected from $Ga_2O_3$, $In_2O_3$ and $Cr_2O_3$.

Therefore, repeat overwriting capability of the phase-change information recording medium can be further improved.

In the information recording medium of the present invention, M1 can be Dy.

Also, M1 can be a mixture of Dy and Y.

Therefore, recording sensitivity and repeat overwriting capability of the phase-change information recording medium can be improved.

A method for manufacturing an information recording medium of the present invention comprises at least forming a recording layer and forming a dielectric layer, wherein a sputtering target comprising at least O and M1 (provided that M1 is at least one element selected from Sc, Y, La, Gd, Dy and Yb) is used in forming the dielectric layer.

Therefore, the phase-change information recording medium with high recording sensitivity and superior repeat overwriting capability can be manufactured.

A method for manufacturing an information recording medium of the present invention comprises forming at least two information layers, wherein forming at least one information layer includes forming a recording layer and forming a dielectric layer, and a sputtering target comprising at least O and M1 (provided that M1 is at least one element selected from Sc, Y, La, Gd, Dy and Yb) can be used in forming the dielectric layer.

Therefore, in the phase-change information recording medium, an information layer with high recording sensitivity and superior repeat overwriting capability can be manufactured.

The sputtering target used in forming the dielectric layer may further comprise M2 (provided that M2 is at least one element selected from Zr, Hf, and Si).

Therefore, the phase-change information recording medium with superior repeat overwriting capability can be manufactured.

Also, the sputtering target used in forming dielectric layer may further comprise M3 (provided that M3 is at least one element selected from Al, Ga, Mg, Zn, Ta, Ti, Ce, In, Sn, Te, Nb, Cr, Bi, Al, Ge, N and C).

Therefore, the phase-change information recording medium with high recording sensitivity and superior repeat overwriting capability can be manufactured.

The sputtering target used in forming the dielectric layer may be represented by the composition formula $M1_hM2_iO_{100-h-i}$ (provided that $5<h<45$ and $0<i<30$ (atom %)).

Therefore, the phase-change information recording medium with superior repeat overwriting capability can be manufactured.

Also, the sputtering target used in forming the dielectric layer may be represented by the composition formula $M1_jM3_kO_{100-j-k}$ (provided that $0<j<50$, $0<k<90$ and $20<j+k<100$ (atom %)).

Therefore, the phase-change information recording medium with high recording sensitivity and superior repeat overwriting capability can be manufactured.

The sputtering target used in forming the dielectric layer may be represented by the composition formula $M1_lM2_mM3_nO_{100-l-m-n}$ (provided that $0<l<45$, $0<m<30$, $0<n<90$ and $20<l+m+n<100$ (atom %)).

Therefore, the phase-change information recording medium with high recording sensitivity and superior repeat overwriting capability can be manufactured.

The sputtering target used in forming the dielectric layer may comprise $M1_2O_3$.

Therefore, the phase-change information recording medium with high recording sensitivity and superior repeat overwriting capability can be manufactured.

The composition of the sputtering target used in forming the dielectric layer may be represented by $M1_2O_3$-$M2O_2$.

Therefore, the phase-change information recording medium with superior repeat overwriting capability can be manufactured.

The sputtering target used in forming the dielectric layer further may comprise D (provided that D is at least one compound selected from $Al_2O_3$, $Ga_2O_3$, MgO, ZnO, $Ta_2O_5$, $TiO_2$, $CeO_2$, $In_2O_3$, $SnO_2$, $TeO_2$, $Nb_2O_5$, $Cr_2O_3$, $Bi_2O_3$, AlN, Cr—N, Ge—N, $Si_3N_4$ and SiC).

Therefore, the phase-change information recording medium with high recording sensitivity and superior repeat overwriting capability can be manufactured.

The sputtering target used in forming the dielectric layer may be represented by the composition formula $(M1_2O_3)_s(M2O_2)_{100-s}$ (provided that $15 \leq s <_{100}$ (mol %)).

Therefore, the phase-change information recording medium with superior repeat overwriting capability can be manufactured.

The sputtering target used in forming the dielectric layer may be represented by the composition formula $(M1_2O_3)_t(D)_{100-t}$ (provided that $15 \leq t < 100$ (mol %)).

Therefore, the phase-change information recording medium with high recording sensitivity and superior repeat overwriting capability can be manufactured.

The sputtering target used in forming the dielectric layer may be represented by the composition formula $(M1_2O_3)_u(M2O_2)_v(D)_{100-u-v}$ (provided that $15 \leq u \leq 95$, $0 < v \leq 80$ and $15 < u+v < 100$ (mol %)).

Therefore, the phase-change information recording medium with high recording sensitivity and superior repeat overwriting capability can be manufactured.

In the method for manufacturing an information recording medium of the present invention, forming an interface layer between forming the recording layer and forming the dielectric layer may be further provided.

Therefore, the phase-change information recording medium with superior repeat overwriting capability can be manufactured.

In forming the dielectric layer, either Ar gas is used or a gas mixture of Ar gas and $O_2$ gas may be used.

Therefore, the phase-change information recording medium with high recording sensitivity and superior repeat overwriting capability can be manufactured.

As mentioned above, according to the phase-change information recording medium of the present invention, recording sensitivity and repeat overwriting capability can be improved. Also, according to the method for manufacturing a phase-change information recording medium of the present invention, a phase-change information recording medium of the present invention can easily manufactured.

PREFFERED EMBODIMENTS OF THE PRESENT INVENTION

The best embodiments of the invention are explained below with reference to the diagrams. Furthermore, while examples of embodiments are given below, the present invention is not limited to these embodiments. Moreover, in the embodiments given below, where there are multiple occurrences of same component identified by the same symbol, that component will be omitted from the explanation.

Embodiment 1

Figure 1:
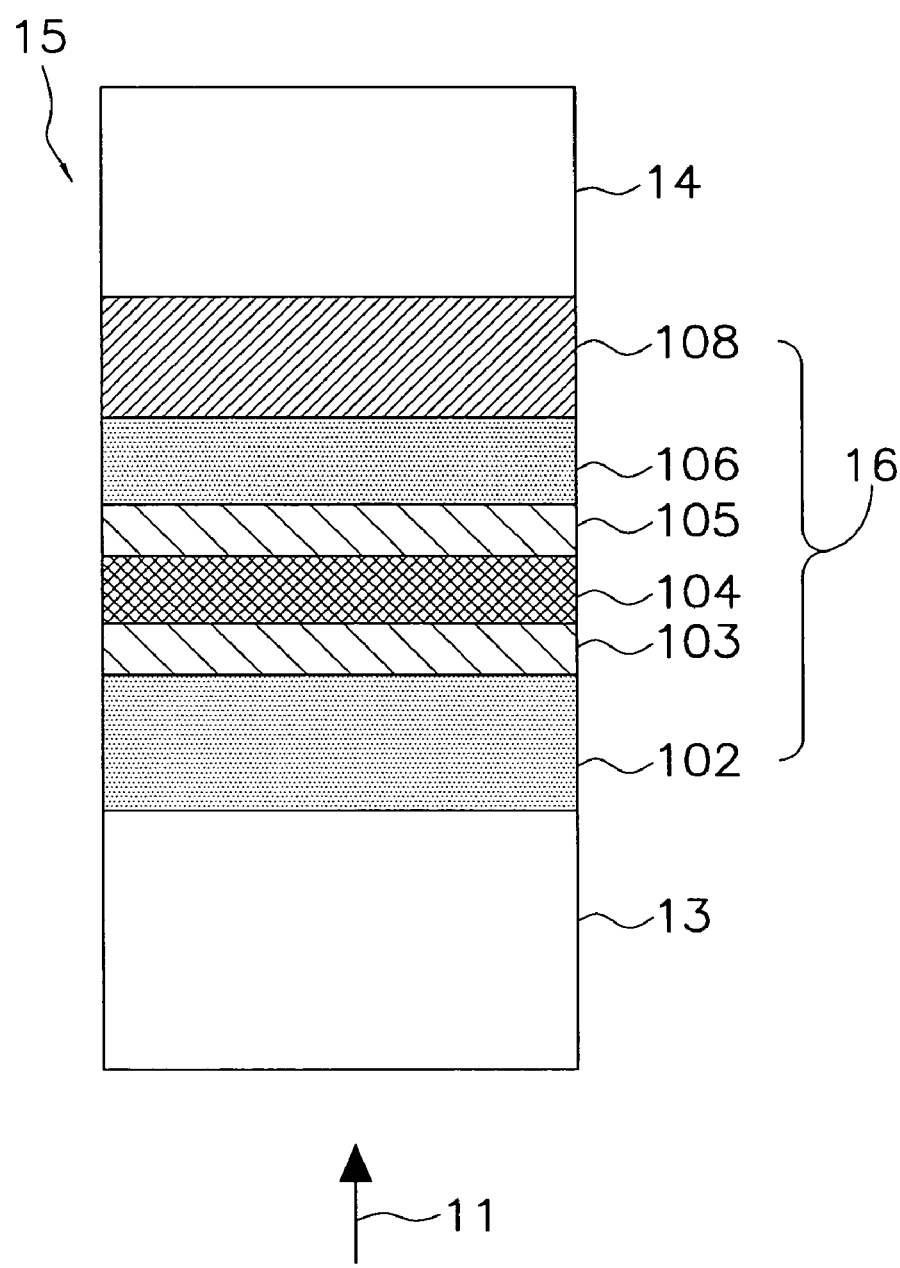
FIG. 1 is a partial cross-sectional diagram showing an example of a layer structure on an information recording medium comprising one information layer of the present invention.

An example of an information recording medium of the present invention is explained in Embodiment 1. A partial cross-sectional diagram of information recording medium 15 of Embodiment 1 is shown in FIG. 1. Information recording medium 15 is an optical information recording medium wherein it is possible to record and/or reproduce information by means of irradiating with laser beam 11.

Information recording medium 15 is constituted from films of information layer 16 and dielectric layer 13 formed on substrate 14. The material of transparent layer 13 is constituted from a resin such as a photocurable resin (particularly an ultraviolet radiation-curable resin) or a slow-acting resin or the like as well as a dielectric or the like, preferably with low light absorption with respect to laser beam 11 being used, preferably with low optical birefringence in the short-wavelength region. In addition, a transparent disk of a resin such as polycarbonate or amorphous polyolefin or PMMA or the like, or glass can be used for transparent layer 13. In this case, it is possible for transparent layer 13 to be bonded to first dielectric layer 102 by using a resin such as such as a photocurable resin (particularly an ultraviolet radiation-curable resin) or a slow-acting resin or the like.

Since the wavelength λ of laser beam 11 will determine the spot diameter when laser beam 11 is focused (the shorter the wavelength, the smaller will be the spot diameter achievable by focusing), for high density information, In particular a wavelength of $\leq 450$ nm is preferred, and moreover since the light absorption in transparent layer 13 becomes larger below 350 nm, a wavelength within the range 350 nm to 450 nm is more preferred.

Substrate 14 is a transparent, disk-shaped substrate. For example, a resin such as polycarbonate or amorphous polyolefin or PMMA or the like, or glass can be used for substrate 14.

Depending on the requirements, a guide groove for guiding the laser beam can be formed in the surface of the information layer 16 side of substrate 14. It is preferable for the surfaces of the information layer 16 side and the opposite side of substrate 14 to be smooth. For the material of substrate 14, polycarbonate is particularly useful from the perspective of superior transcribability and mass producibility, and low cost. Furthermore, from the perspective of having adequate strength and for the thickness of information recording medium 15 to be on the order of 1.2 mm, a thickness for substrate 14 in the range of 0.5 mm to 1.2 mm is preferred. In addition, when the thickness of transparent layer 13 is on the order of 0.6 mm (favorable record/reproduce operations are possible with NA=0.6), a thickness for information recording medium 15 within the range of 5.5 mm to 6.5 mm is preferred. Moreover, when the thickness of transparent layer 13 is on the order of 0.1 mm (favorable record/reproduce operations are possible with NA=0.85), a thickness for information recording medium 15 within the range of 1.05 mm to 1.15 mm is preferred.

The constitution of information layer 16 is explained in detail below.

Positioned in order from the laser beam 11 incident side, information layer 16 is provided with first dielectric layer 102, first interface layer 103, recording layer 104, second interface layer 105, second dielectric layer 106 and reflective layer 108.

First dielectric layer 102 is constituted from a dielectric. First dielectric layer 102 acts to prevent recording layer 104 from undergoing oxidation, corrosion, deformation and the like, acts to adjust the optical path and enhance the light absorption efficiency of recording layer 104, and acts to increase the magnitude of the signal strength when there are large fluctuations in the amount of reflected light before and after recording. For example, oxides such as $TiO_2$, $ZrO_2$, $HfO_2$, $ZnO$, $Nb_2O_5$, $Ta_2O_5$, $SiO_2$, $SnO_2$, $Al_2O_3$, $Bi_2O_3$, $Cr_2O_3$, $Ga_2O_3$, $In_2O_3$, $Sc_2O_3$, $Y_2O_3$, $La_2O_3$, $Gd_2O_3$, $Dy_2O_3$, $Yb_2O_3$, $MgO$, $CeO_2$, $TeO_2$ and the like can be used in first dielectric layer 102. In addition, nitrides such as C—N, Ti—N, Zr—N, Nb—N, Ta—N, Si—N, Ge—N, Cr—N, Al—N, Ge—Si—N, Ge—Cr—N and the like can also be used. Moreover, sulfides such as ZnS and the like, carbides such as SiC and the like, fluorides such as $LaF_3$ and the like and C can also be used. In addition, mixtures of the above materials can also be used. For example, ZnS—$SiO_2$ that is a mixture of ZnS and $SiO_2$ is a particularly superior material for first dielectric layer 102. ZnS—$SiO_2$ is an amorphous material with high refractive index, rapid film deposition rate, favorable mechanical characteristics and resistance to humidity.

The film thickness of first dielectric layer 102 can be determined exactly according to a calculation based on the matrix method, so as to satisfy conditions that increase the change in the amount of reflected light between the crystalline phase and amorphous phase of recording layer 104. First interface layer 103 acts to prevent the mass transfer that arises between first dielectric layer 102 and recording layer 104 due to repeated recording. In addition, first interface layer 103 acts to promote the crystallinity of recording layer 104. First interface layer 103 is constituted from a high melting point material that does not melt during recording when there is little light absorption, and it is preferable for the material to have good adhesiveness toward recording layer 104. First interface layer 103 is a high melting point material that does not melt during recording, and has the important characteristic that it does not melt and mix with recording layer 104 when the recording layer is irradiated with high power laser beam 11. If mixed with the material of first interface layer 103, the composition of recording layer 104 will be altered and its overwriting capability will be lowered substantially. Moreover, having a material that possesses good adhesiveness with recording layer 104 is an important characteristic for maintaining reliability.

The same series of materials as were used for first dielectric layer 102 can be used in first interface layer 103. Among these, the use of materials that include Cr and O in particular are preferred because they are better able to maintain the crystallinity of recording layer 104. Among these, it is preferable to include the oxide $Cr_2O_3$ formed from Cr and O. $Cr_2O_3$ is a material that possesses good adhesiveness toward recording layer 104.

In addition, materials that include Ga and O can also be used in first interface layer 103. Among these, it is preferable to include the oxide $Ga_2O_3$ formed from Ga and O. $Ga_2O_3$ is a material that possesses good adhesiveness toward recording layer 104.

Moreover, materials that include In and O can also be used in first interface layer 103. Among these, it is preferable to include the oxide $In_2O_3$ formed from In and O. $In_{2O3}$ is a material that possesses good adhesiveness toward recording layer 104.

Furthermore, in addition to Cr and O, Ga and O, and In and O, materials containing at least one element selected from Zr, Hf and Y are also favorable for first interface layer 103. $ZrO_2$ and $HfO_2$ are transparent materials with high melting points of approximately 2700° C. to 2800° C., and with low thermal conductivity for an oxide, and favorable repeat overwriting capability. Additionally, $Y_2O_3$ is a transparent material that can also act to stabilize $ZrO_2$ and $HfO_2$. By using mixtures of these three types of oxide, even when formed partially in contact with recording layer 104, it is possible to realize information recording medium 15 with superior repeat overwriting capability and high reliability.

In order to maintain adhesiveness with recording layer 104, it is preferable for the $Cr_2O_3$, $Ga_2O_3$ or $In_2O_3$ content in first interface layer 103 to be $\geqq 10$ mol %. Furthermore, in order to keep the light absorption low, it is preferable for the $Cr_2O_3$ content of first interface layer 103 to be $\leqq 70$ mol %, as there is a tendency for the light absorption to increase with higher $Cr_2O_3$ content.

In addition to Cr, Ga, In, Zr, Hf. Y and O, the use of Si-containing materials for first interface layer 103 is also favorable. By including $SiO_2$, the transparency becomes high, and it is possible to realize a first information layer 16 with superior recording characteristics. It is preferable for the $SiO_2$ content in first interface layer 103 to be $\geqq 5$ mol %, and it is also preferably $\leqq 50$ mol % in order to maintain adhesiveness with recording layer 104. It is more preferable for the $SiO_2$ content to be $\geqq 10$ mol % and $\leqq 40$ mol %.

To avoid having the change in the amount of reflected light become smaller before and after recording on information layer 16 due to light absorption in first interface layer 103, it is desirable for the film thickness of the interface layer to be within the range of 0.5 nm to 15 nm, and it is more preferable for it to be within the range of 1 nm to 7 nm.

In the same manner as with first interface layer 103, second interface layer 105 acts to prevent any mass transfer that arises between first dielectric layer 106 and recording layer 104 due to repeated recording. In addition, second interface layer 105 acts to promote the crystallinity of recording layer 104. Substantially the same series of materials as were used for first dielectric layer 102 can be used in second interface layer 105. Among these, in particular the use of materials containing Ga and O are preferred. Among these, it is preferable to include the oxide $Ga_2O_3$ formed from Ga and O. In addition, materials that include Cr and O can also be used in second interface layer 105. Among these, it is preferable to include the oxide $Cr_2O_3$ formed from Cr and O. Moreover, materials that include In and O can also be used in second interface layer 105. Among these, it is preferable to include the oxide $In_2O_3$ formed from In and O. Furthermore, in the same manner as for first interface layer 103, in addition to Cr and O, Ga and O, and In and O, materials containing at least one element selected from Zr, Hf and Y are also favorable, and in addition to Cr, Ga, In, Zr, Hf. Y and O, additionally the use of Si-containing materials is also favorable. Since there is a tendency for the adhesiveness of second interface layer 105 to be poorer than that of first interface layer 103, it is preferable for second interface layer 105 to have a higher content of $Cr_2O_3$, $Ga_2O_3$ or $In_2O_3$ than for first interface layer 103, of $\geq 20$ mol %.

In the same manner as with first interface layer 103, a film thickness for second interface layer 105 within the range of 0.5 nm to 15 nm is desirable, and within the range of 1 nm to 7 run is more preferable.

Substantially the same series of materials as were used for first dielectric layer 102 can be used with second dielectric layer 106. Among these, the use of materials that include in particular M1 (provided that M1 is at least one element selected from Sc, Y, La, Gd, Dy and Yb) and O are preferable. Among these, it is preferable to include the oxide $M1_2O_3$ formed from M1 and O. Since $M1_2O_3$ is a material with low thermal conductivity that does not include S, it is a superior material for second dielectric layer 106, and naturally it can also be used in first dielectric layer 102. Moreover, in addition to M1 and O, a material that further includes M2 (provided that M2 is at least one element selected from Zr, Hf and Si) can also be used in second dielectric layer 106. Among these, it is preferable to include the oxide $M2O_2$ formed from M2 and O. For these, signal quality is high because the transparency is high, and they are thermally stable because the melting point is high. Furthermore, Si acts to adjust the refractive index. Furthermore, when the composition of second dielectric layer 106 is represented by the composition formula $M1_a M2_b O_{100-a-b}$ (atom %), it is preferable for a and b to be in the ranges $10 < a < 40$ and $0 < b < 25$, respectively, and it is more preferable for a and b to be in the ranges $15 < a < 39$ and $1 < b < 21$, respectively. Additionally, when the composition of second dielectric layer 106 is represented by the composition formula $(M1_2O_3)_x(M2O_2)_{100-x}$ (mol %), x is preferably in the range $20 \leq x \leq 95$, and more preferably in the range $30 \leq x \leq 90$.

Moreover, in addition to M1 and O, a material that further includes M3 (provided that M3 is at least one element selected from Al, Ga, Mg, Zn, Ta, Ti, Ce, In, Sn, Te, Nb, Cr, Bi, Al, Ge, N and C) can also be used in second dielectric layer 106. Among these, it is preferable to include D (provided that D is at least one compound selected from $Al_2O_3$, $Ga_2O_3$, MgO, ZnO, $Ta_2O_5$, $TiO_2$, $CeO_2$, $In_2O_3$, $SnO_2$, $TeO_2$, $Nb_2O_5$, $Cr_2O_3$, $Bi_2O_3$, AlN, Cr—N, Ge—N, $Si_3N_4$ and SiC). In addition, when the composition of second dielectric layer 106 is represented by the composition formula $M1_c M3_d O_{100-c-d}$ (atom %), c and d and c+d are preferably in the ranges $5 < c < 45$, $0 < d < 85$ and $25 < c+d < 95$, respectively, and are more preferably in the ranges $8 < c < 39$, $1 < d < 77$ and $26 < c+d < 90$, respectively. Additionally, when the composition of second dielectric layer 106 is represented by the composition formula $(M1_2O_3)_y(D)_{100-y}$ (mol %), y is preferably in the range $20 \leq y \leq 95$, and more preferably in the range $30 \leq x \leq 90$.

Moreover, in addition to M1 and O, a material that further includes M2 and M3 can also be used in second dielectric layer 106. Among these, it is preferable when $M2O_2$ is formed from M2 and O and where M3 is represented by D. Furthermore, when the composition of second dielectric layer 106 is represented by the composition formula $M1_e M2_f M3_g O_{100-e-f-g}$ (atom %), it is preferable when e, f, g and e+f+g are in the ranges $5 < e < 40$, $0 < f < 25$, $0 < g < 85$, $25 < e+f+g < 95$, respectively. Additionally, when the composition of second dielectric layer 106 is represented by the composition formula $(M1_2O_3)_z(M2O_2)_w(D)_{100-z-w}$ (mol %), z, w and z+w are preferably in the ranges $20 \leq z \leq 90$, $5 \leq w \leq 75$ and $25 \leq z+w \leq 95$, respectively.

The film thickness of second dielectric layer 106 is preferably within the range of 2 nm to 75 nm, and is more preferably within the range of 2 nm to 40 nm. By selecting a film thickness for second dielectric layer 106 within this range, any heat generated in recording layer 104 can be effectively dissipated on the side of reflective layer 108.

Recording layer 104 in constituted of a material that will undergo a phase-change between a crystalline phase and an amorphous phase due to irradiation by laser beam 11. Recording layer 104 can be formed from a material that includes for example Ge, Te, and M4 (provided that M4 is at least one element selected from Sb, Bi and In), and that undergoes a reversible phase-change. Specifically, recording layer 104 can be formed from a material represented by $Ge_A M2_B Te_{3+A}$ that has a favorable recording shelf-life with a low transfer rate in a stable amorphous phase, and a favorable overwriting shelf-life with an elevated melting point and a high transfer rate with little reduction in the crystallization speed, where it is desirable to satisfy the relationship $0 < A \leq 60$, and it is more preferable to satisfy the relationship $4 \leq A \leq 40$. Moreover, for the amorphous phase to be stable and to have little reduction in the crystallization speed, satisfying the relationship $1.5 \leq B \leq 7$ is preferable, and it is more preferable to satisfy the relationship $2 \leq B \leq 4$.

Additionally, it is also favorable for recording layer 104 to be formed from a material represented by $(Ge-M5)_A M4_B Te_{3+A}$ (provided that M5 is at least one element selected from Sn and Pb) that undergoes a reversible phase-change. When this material is used, since the element M5 that substitutes for Ge will increase the crystallizability, it is possible to obtain satisfactory erase ratios even when the film thickness of recording layer 104 is thin. For element M5, Sn is more preferable from the perspective of being less toxic. When this material is used, it is preferable for $0 < A \leq 60$ (with $4 \leq A \leq 40$ being more preferable), and $1.5 \leq B \leq 7$ (with $2 \leq B \leq 4$ being more preferable).

In addition, recording layer 104 can be formed from a material that includes Sb and M6 (provided that M6 is at least one element selected from V, Mn, Ga, Ge, Se, Ag, In, Sn, Te, Pb, Bi, Tb, Dy and Au) and that undergoes a reversible phase-change. Specifically, recording layer 104 can be formed from a material that is represented by $Sb_x M6_{100-x}$ (atom %). When X satisfies the relationship $50 \leq X \leq 95$, the reflectance difference between the crystalline state and the amorphous state of recording layer 104 of information recording medium 15 can become greater, and favorable record/reproduce characteristics can be obtained. Among these, when $75 \leq X \leq 95$, the crystallization speed is particularly rapid, and favorable overwriting capability with a high transfer rate can be obtained. In addition, when $50 \leq X \leq 75$, the amorphous state is particularly stable, and favorable recording capability with a low transfer rate can be obtained.

In order for the recording sensitivity of information layer 16 to be higher, the film thickness of recording layer 104 is preferably within the range 6 nm to 15 nm. Even within this range, when recording layer 104 is thick, the thermal effect on the adjacent region becomes higher due to the diffusion of the heat along the in-plane direction. Moreover, when recording layer 104 is thin, the reflectance of information layer 16 becomes smaller. Consequently, it is more preferable for the film thickness of recording layer 104 to be within the range 8 nm to 13 nm.

Additionally, recording layer 104 can be formed of a material represented as Te—Pd—O that undergoes an irreversible phase-change. In this case, it is preferable for the film thickness of recording layer 104 to be within the range 10 nm to 40 nm.

Reflective layer 108 possesses an optical function that is to increase the amount of light absorbed by recording layer 104. In addition, reflective layer 108 possesses a thermal function that is to facilitate the process of recording layer 104 becoming amorphous by rapidly diffusing any heat generated by recording layer 104. Furthermore, reflective layer 108 possesses the capability of protecting multi-layer films from the use environment.

For the material of reflective layer 108, simple metals with high thermal conductivity such as for example Ag, Au, Cu and Al can be used. Moreover, alloys such as Al—Cr, Al—Ti, Al—Ni, Al—Cu, Au—Pd, Au—Cr, Ag—Pd, Ag—Pd—Cu, Ag—Pd—Ti, Ag—Ru—Au, Ag—Cu—Ni, Ag—Zn—Al, Ag—Nd—Au, Ag—Nd—Cu, Ag—Bi, Ag—Ga, Ag—Ga—In, Ag—In, Ag—In—Sn or Cu—Si can also be used. In particular, since Ag alloys have significant thermal conductivity, they are preferred as materials for reflective layer 108. For the heat diffusion capability of reflective layer 108 to be suitable, a thickness of $\geq 30$ nm is preferred. Also within this range, when reflective layer 108 is thicker than 200 nm, its heat diffusion capability becomes too great and the recording sensitivity of information layer 16 will decrease. Consequently, it is more preferable for the film thickness of reflecting layer 108 to be within the range 30 nm to 200 nm.

Interface layer 107 (not shown) can be placed between reflecting layer 108 and second dielectric layer 106. In this case, materials that can be used for interface layer 107 are those that have a lower thermal conductivity than the materials described for reflecting layer 108. When an Ag alloy is used for reflecting layer 108, for example Al or an Al alloy can be used for interface layer 107. Moreover, elements such as Cr, Ni, Si and C and the like, and oxides such as $TiO_2$, $ZrO_2$, $HfO_2$, ZnO, $Nb_2O_5$, $Ta_2O_5$, $SiO_2$, $SnO_2$, $Al_2O_3$, $Bi_2O_3$, $Cr_2O_3$, $Ga_2O_3$ and $In_2O_3$ and the like can be used in interface layer 107. Additionally, nitrides such as C—N, Ti—N, Zr—N, Nb—N, Ta—N, Si—N, Ge—N, Cr—N, Al—N, Ge—Si—N, Ge—Cr—N and the like can be used. In addition, sulfides such as ZnS and the like, carbides such as SiC and the like, fluorides such as $LaF_3$ and the like and carbon can also be used. Moreover, mixtures of the above materials can also be used. Additionally, a film thickness within the range 3 nm to 100 nm is preferred, with 10 nm to 50 nm being more preferred.

In information layer 16, with recording layer 104 having reflectance $R_c$ (%) when in the crystalline phase and reflectance $R_a$ (%) when in the amorphous phase, it is preferred when these satisfy the relation $R_a < R_c$. When this is the case, the reflectance is high in the initial state when information has not been recorded, so that record/reproduce operations can be carried out in a stable manner. In addition, to obtain a larger reflectance difference and favorable record/reproduce characteristics, it is preferable for $R_c$ and $R_a$ to satisfy $0.2 \leq Ra \leq 10$ and $12 \leq Ra \leq 40$, and it is more preferable for them to satisfy $0.2 \leq R_a \leq 5$ and $12 \leq R_c < 30$.

Information recording medium 15 can be manufactured by the method explained below.

First, information layer 16 is laminated over substrate 14 (of thickness 1.1 mm, for example). The information layer is constituted from a single-layer film or a multi-layer film, and such layers can be formed within a coating device through the use of sequential sputtering with a sputtering target constituted from the material.

Specifically, first a film of reflecting layer 108 is formed over substrate 14. Reflecting layer 108 is formed by sputtering with a sputtering target constituted from a metal or alloy that constitutes reflecting layer 108 in an atmosphere of Ar gas, or in an atmosphere of a gas mixture of Ar gas and a reaction gas (at least one gas selected from $O_2$ gas and $N_2$ gas).

Next, depending on the requirements, a film of interface layer 107 is formed over reflecting layer 108. Interface layer 107 is formed by sputtering with a sputtering target constituted from an element or compound that constitutes interface layer 107 in an atmosphere of Ar gas, or in an atmosphere of a gas mixture of Ar gas and a reaction gas (at least one gas selected from O2 gas and N2 gas).

Subsequently, a film of second dielectric layer 106 is formed over reflective layer 108 or interface layer 107. Second dielectric layer 106 is formed by sputtering with a sputtering target constituted from an element or compound that constitutes second dielectric layer 106 (for example, $M1_2O_3$) in an atmosphere of Ar gas, or in an atmosphere of a gas mixture of Ar gas and a reaction gas (at least one gas selected from O2 gas and N2 gas). Moreover, second dielectric layer 106 is formed by reactive sputtering with a sputtering target constituted from a metal that constitutes second dielectric layer 106 in an atmosphere of a gas mixture of Ar gas and a reaction gas. Furthermore, when the sputtering target for forming a film of second dielectric layer 106 is represented by the composition formula $M1_hM2_iO_{100-h-i}$ (atom %), h and i are preferably within the ranges of $5<h<45$ and $0<i<30$, respectively, and are more preferably within the ranges of $20<h<44$ and $0<i<26$. Additionally, when the sputtering target for forming a film of second dielectric layer 106 is represented by the composition formula $M1_jM3_kO_{100-j-k}$ (atom %), j, k and j+k are preferably within the ranges of $0<j<50$, $0<k<90$ and $20<j+k<100$, respectively, and are more preferably within the ranges of $3<j<44$, $0<k<82$ and $21<j+k<95$. Moreover, when the sputtering target for forming a film of second dielectric layer 106 is represented by the composition formula $M1_lM2_mM3_nO_{100-l-m-n}$ (atom %), l, m, n and l+m+n are preferably within the ranges of $0<l<45$, $0<m<30$, $0<n<90$, $20<l+m+n<100$. In addition, when the sputtering target for a film of second dielectric layer 106 is represented by the composition formula $(M1_2O_3)_s(M2O_2)_{100-s}$ (mol %), s is preferably within the range of $15 \leq s<100$, and more preferably within the range of $25 \leq s \leq 95$. Additionally, when the sputtering target for forming a film of second dielectric layer 106 is represented by the composition formula $(M1_2O_3)_t(D)_{100-t}$ (mol %), t is preferably within the range of $15 \leq t<100$, and more preferably within the range of $25 \leq t \leq 95$. Moreover, when the sputtering target for forming the film of second dielectric layer 106 can be represented by the composition formula $(M1_2O_3)_u(M2O_2)_v(D)_{100-u-v}$ (mol %), it is preferable for u, v, and u+v to be in the ranges $15 \leq u \leq 95$, $0<v \leq 80$ and $15<u+v<100$, respectively.

In addition, second dielectric layer 106 can be formed by using a plurality of power sources for simultaneous sputtering from various sputtering targets such as $M1_2O_3$, $M2O_2$ or D. Additionally, second dielectric layer 106 can also be formed by using a plurality of power sources for simultaneous sputtering from a binary sputtering target or a ternary sputtering target or the like that combines any of the compounds from $M1_2O_3$, $M2O_2$ or D. Also in this case, the dielectric layer can be formed by sputtering in an atmosphere of Ar gas, or in an atmosphere of a gas mixture of Ar gas and a reaction gas (particularly $O_2$ gas).

Next, depending on the requirements, a film of second interface layer 105 is formed over reflecting layer 108, interface layer 107 or second dielectric layer 106. Second interface layer 105 can be formed in substantially the same manner as for second dielectric layer 106.

Next, a film of recording layer 104 is formed over second dielectric layer 106 or second interface layer 105. Depending on its composition, recording layer 104 can be formed by sputtering with the use of a single power source with a sputtering target constituted from Ge—Te—M4 alloy, or a sputtering target constituted from Ge-M5-Te-M4 alloy, or a sputtering target constituted from Sb-M6 alloy, or a sputtering target constituted from Te-Pd alloy.

For the atmosphere gas used for sputtering, Ar gas, Kr gas, a gas mixture with Ar gas and a reaction gas, or a gas mixture with Kr gas and a reaction gas can be used. Moreover, recording layer 104 can be formed by simultaneous sputtering with the use of a plurality of power sources from various sputtering targets of Ge, Te, M4, M5, Sb, M6 or Pd. In addition, recording layer 104 can be formed by simultaneous sputtering with the use of a plurality of power sources from a binary sputtering target or a ternary sputtering target or the like that combines any of the elements from Ge, Te, M4, M5, Sb, M6 or Pd. In these cases also, the recording layer can be formed by sputtering in an atmosphere of Ar gas, an atmosphere of Kr gas, an atmosphere of a gas mixture with Ar gas and a reaction gas, or an atmosphere of a gas mixture with Kr gas and a reaction gas can be used.

Next, depending on the requirements, a film of first interface layer 103 is formed over recording layer 104. First interface layer 103 can be formed in substantially the same manner as for second dielectric layer 106.

Next, a film of first dielectric layer 102 is formed over recording layer 104 or first interface layer 103. First dielectric layer 102 can be formed in substantially the same manner as for second dielectric layer 106.

Finally, transparent layer 13 is formed over first dielectric layer 102. Transparent layer 13 can be formed over first dielectric layer 102 by applying a photocurable resin (particularly an ultraviolet radiation-curable resin) or a slow-acting resin as a spin coating, after which the resin is cured. Additionally, it is also suitable to use a transparent disk of a resin such as polycarbonate or amorphous polyolefin or PMMA or the like, or a substrate of glass or the like for transparent layer 13. In this case, transparent layer 13 can be formed by applying a resin such as such as a photocurable resin (particularly an ultraviolet radiation-curable resin) or a slow-acting resin or the like over first dielectric layer 102, and after the substrate is bonded over first dielectric layer 102 by spin coating the resin is cured. Moreover, an adhesive resin is applied uniformly to the substrate beforehand, and this can be bonded to first dielectric layer 102.

Furthermore, after a film of first dielectric layer 102 is formed, or after transparent layer 13 is formed, depending on the requirements it is also favorable to carry out an initialization process in which the entire recording layer 104 is crystallized. The crystallization of recording layer 104 can be carried out by irradiating with a laser beam.

Information recording medium 15 can be manufactured in the above manner. Furthermore, while a film of each of the layers is formed by using the sputtering method in the present embodiment, the embodiment is not limited to this method and it is also possible to use a vacuum deposition method, an ion plating method, a CVD method, an MBE method or the like.

Embodiment 2

Figure 2:
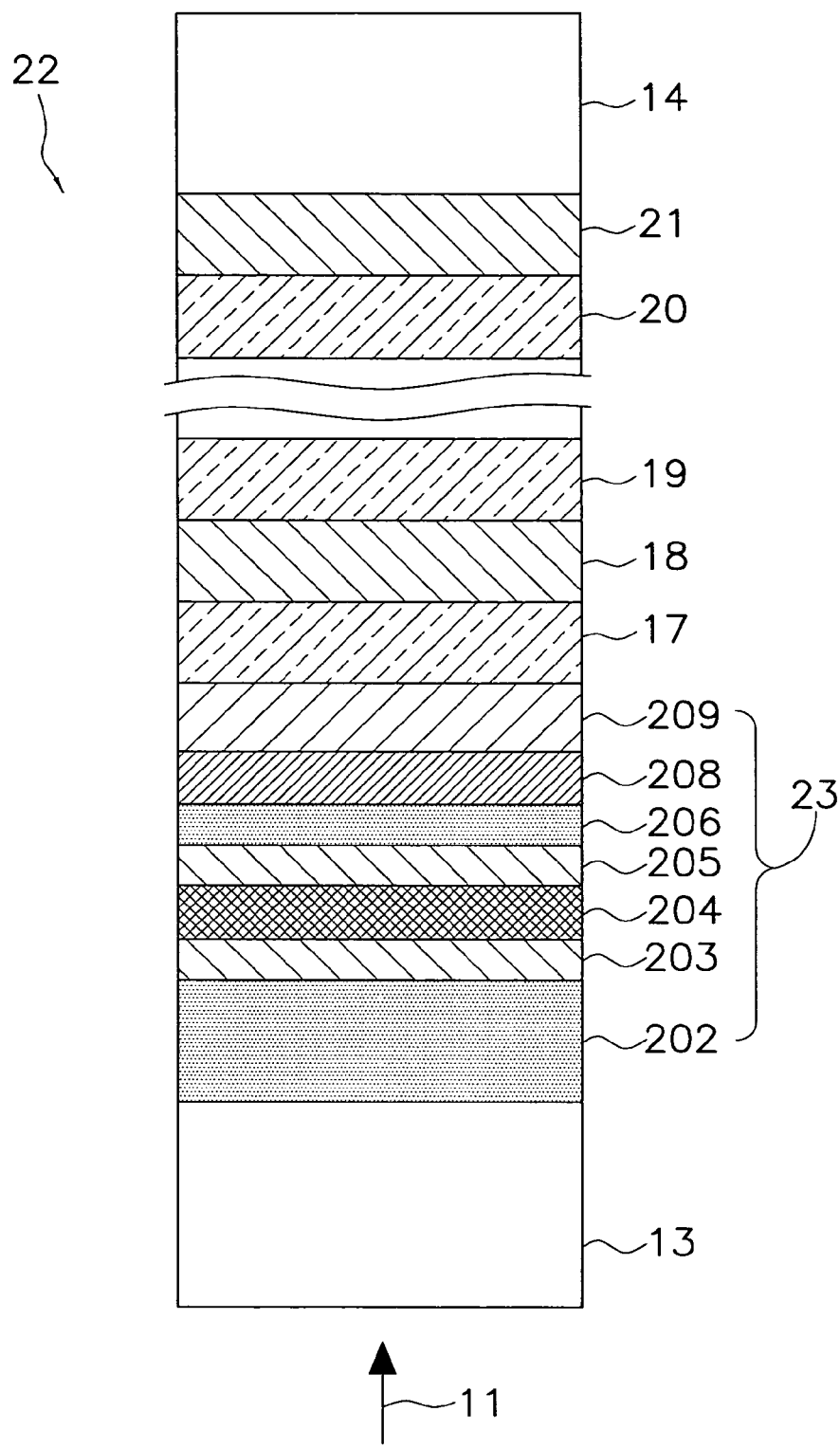
FIG. 2 is a partial cross-sectional diagram showing an example of a layer structure on an information recording medium comprising N information layers of the present invention.

An example of an information recording medium of the present invention is explained in Embodiment 2. A partial cross-sectional diagram of information recording medium 22 of Embodiment 2 is shown in FIG. 2. Information recording medium 22 is a multilayer optical information recording medium wherein it is possible to record and/or reproduce information by means of irradiating with laser beam 11 from one side.

Information recording medium 22 is constituted on substrate 14 from N groups (where N is a natural number that satisfies $N \geqq 2$) of information layers 21 and 18, first information layer 23 and transparent layer 13 through sequential lamination of optical separation layers 20, 19, 17 and the like. Here, the first information layer 23 and information layer 18, which are not over (N−1)th phase from the laser beam 11 incident side (the Nth information layer counting from the laser beam 11 incident side is referred to below as the $N^{th}$ information layer), are transparent-type information layers. Substantially the same materials as were used in Embodiment 1 can be used in substrate 14 and transparent layer 13. In addition, these will also have substantially the same form and function as was explained in Embodiment 1.

The material of optical separation layers 20, 19, 17 and the like is constituted from a resin such as a photocurable resin (particularly an ultraviolet radiation-curable resin) or a slow-acting resin as well as a dielectric or the like, preferably with low light absorption with respect to laser beam 11 being used, and preferably with low optical birefringence in the short-wavelength region.

Optical separation layers 20, 19, 17 and the like are layers that are provided in order to differentiate the corresponding focus positions for first information layer 23, information layers 18 and 21 and the like for information recording medium 22. It is necessary for the thickness of optical separation layers 20, 19, 17 and the like to be greater than or equal to that is the focal depth ($\Delta Z$) that is determined by the numerical aperture (NA) of the objective lens and the wavelength of laser beam 11 ($\lambda$). When the standard focal point intensity can be assumed to be 80% of the aplanatic case, $\Delta Z$ can be approximated by $\Delta Z = \lambda/[2(NA)^2]$. When $\lambda = 405$ nm and NA=0.85, $\Delta Z = 0.280$ μm, so that the focal depth will be within ±0.3 μm. For this reason, it is necessary in this case for the thickness of optical separation layers 20, 19, 17 and the like to be $\geqq 0.6$ μm. It is desirable for the path between first information layer 23, and information layers 18, 21, and the like to be within the focusable range of laser beam 11 used for the objective lens. Consequently, the total thickness of optical separation layers 20, 19, 17 and the like are preferably within the tolerance allowable for the objective lens (for example, $\leqq 50$ μm).

Depending on the requirements, it is satisfactory to form a guide groove to guide the laser beam on the surface of laser beam 11 incident side of optical separation layers 20, 19, 17 and the like.

In this case, with laser beam 11 irradiating from only one side, it is possible to carry out record/reproduce operations with laser beam 11 on the $K^{th}$ information layer (where K is a natural number such that $1 < K \leqq N$) with the laser beam passing through the first through $(K-1)^{th}$ information layers.

Furthermore, any one from the first information layer to the $N^{th}$ first information layer can also be an information layer for dedicated reproducing use (ROM, Read Only Memory), as well as a write-once information layer (WO, Write Once) that can only be recorded upon a single time First information layer 23 is described below in detail.

First information layer 23 is provided with third dielectric layer 202, third interface layer 203, first recording layer 204, fourth interface layer 205, first reflecting layer 208, and adjustable transmittance layer 209, positioned in order from the laser beam 11 incident side.

Materials substantially the same as those in first dielectric layer 102 of Embodiment 1 can be used in third dielectric layer 202. Additionally, the function of third dielectric layer 202 is substantially the same as for first dielectric layer 102 of Embodiment 1.

The film thickness of third dielectric layer 202 can be determined exactly according to a calculation based on the matrix method, so as to satisfy conditions that increase the change in the amount of reflected light between the crystalline phase and amorphous phase of first recording layer 204, and increase the light absorption in first recording layer 204, and increase the transmittance for first information layer 23.

Materials substantially the same as those used for first interface layer 103 in Embodiment 1 can be used in third interface layer 203. Moreover, the function and form of the interface layer 203 will also be substantially the same as for first interface layer 103 in Embodiment 1.

Fourth interface layer 205 adjusts the optical path and acts to elevate the light absorption efficiency of first recording layer 204, and has the function of increasing the magnitude in the change in the amount of reflected light before and after recording and to increase the signal strength. The same series of materials as was used in second interface layer 105 and second dielectric layer 106 in Embodiment 1 can be used in fourth interface layer 205. In addition, the film thickness of fourth interface layer 205 is preferably within the range of 0.5 nm to 75 nm, and is more preferably within the range of 1 nm to 40 nm. By selecting a film thickness for fourth interface layer 205 within this range, any heat generated in first recording layer 204 can be effectively dissipated on the side of first reflective layer 208.

Furthermore, fourth dielectric layer 206 can be positioned between fourth interface layer 205 and first reflective layer 208. Substantially the same series of materials as was used in second dielectric layer 106 in Embodiment 1 can be used in fourth dielectric layer 206.

First recording layer 204 is constituted from a material that undergoes a phase-change between a crystalline phase and an amorphous phase due to irradiation with laser beam 11. First recording layer 204 can be formed, for example, from a material that includes Ge, Te, or M4 and that undergoes a reversible phase-change. Specifically, first recording layer 204 can be formed from a material that can be represented by the composition formula $Ge_A M4_B Te_{3+A}$, that has a favorable recording shelf-life with a low transfer rate in a stable amorphous phase, and a favorable overwriting shelf-life with an elevated melting point and a high transfer rate with little reduction in the crystallization speed, where it is desirable to satisfy the relationship $0<A\leq60$, and it is more preferable to satisfy the relationship $4\leq A\leq40$. Moreover, for the amorphous phase to be stable and to have little reduction in the crystallization speed, it is preferable to satisfy the relationship $1.5\leq B\leq7$, and it is more preferable to satisfy the relationship $2\leq B\leq4$.

Additionally, first recording layer 204 can be formed from a material that can be represented by the composition formula $(Ge-M5)_A M4_B Te_{3+A}$ and undergoes a reversible phase-change. When this material is used, since the element M5 that substitutes for Ge will increase the crystallizability, it is possible to obtain satisfactory erase ratios even when the film thickness of first recording layer 204 is thin. For element M5, Sn is more preferable from the perspective of being less toxic. When this material is used, it is preferable for $0<A\leq60$ (with $4\leq A\leq40$ being more preferable), and $1.5\leq B\leq7$ (with $2\leq B\leq4$ being more preferable).

In order to achieve the required quantity of laser light for the record/reproduce operations in the information layer on the side more distal than first information layer 23 from the laser beam 11 incident side, first information layer 23 must have high transmittance. For this reason, the film thickness of first information layer 23 is preferably $\leq9$ nm, and more preferably within the range of 2 nm to 8 nm.

In addition, first recording layer 204 can be formed from a material that undergoes an irreversible phase-change and can be represented as Te—Pd—O. In this case, it is preferable for the film thickness of first recording layer 204 to be within the range of 5 nm to 30 nm.

First reflecting layer 208 possesses an optical function that is to increase the amount of light absorbed by first recording layer 204. Moreover, first reflective layer 208 possesses a thermal function of rapidly diffusing any heat generated by first recording layer 204 and to facilitate the process of first recording layer 204 becoming amorphous. Furthermore, reflective layer 208 possesses the function of protecting multi-layer films from the use environment.

Substantially the same materials as were used for reflective layer 108 in Embodiment 1 can be used in first reflective layer 208. Additionally, the function of first reflective layer 208 is substantially the same as for reflective layer 108 of Embodiment 1. In particular, since Ag alloys have significant thermal conductivity, they are preferred as materials for first reflective layer 208. In order for first information layer 23 to have the highest possible transmittance, the film thickness of first reflective layer 208 is preferably within the range of 3 nm to 15 nm, and is more preferably within the range of 8 nm to 12 nm. When first reflective layer 208 has a film thickness within this range, its heat diffusion function will be suitable, and it will be able to maintain the reflectance of first information layer 23, and furthermore the transmittance of first information layer 23 will be suitable.

Adjustable transmittance layer 209 is constituted from a dielectric, and functions to adjust the transmittance of first information layer 23. Adjustable transmittance layer 209 makes it possible to achieve both a higher transmittance $T_c$ (%) of first information layer 23 when first recording layer 204 is in a crystalline phase and a higher transmittance $T_a$ (%) of first information layer 23 when first recording layer 204 is in an amorphous phase. Specifically, the level of transmittance in first information layer 23 is raised by from 2% to 10% when it is provided with adjustable transmittance layer 209 as compared to when the adjustable transmittance layer 209 is absent. In addition, adjustable transmittance layer 209 also functions effectively to diffuse any heat generated in first recording layer 204.

In order to raise the transmittances $T_c$ and $T_a$ higher, it is preferable for the refractive index $n_t$ and extinction coefficient $k_t$ of adjustable transmittance layer 209 to satisfy the conditions $2.0\leq n_t$ and $k_t\leq0.1$, and it is more preferable to satisfy the conditions $2.4\leq n_t\leq3.0$ and $k_t<0.05$.

The film thickness L of adjustable transmittance layer 209 is preferably within the range $(1/32)\lambda/n_t\leq L\leq(3/16)\lambda/n_t$ or $(17/32)\lambda/n_t\leq L\leq(11/16)\lambda/n_t$, and is more preferably within the range $(1/16)\lambda/n_t\leq L\leq(5/32)\lambda/n_t$ or $(9/16)\lambda/n_t\leq L\leq(21/32)\lambda/n_t$. Furthermore, based on the wavelenghth $\lambda$ of laser beam 11 and refractive index $n_t$ of adjustable transmittance layer 209, for example, by selecting $350$ nm$\leq\lambda\leq450$ nm and $2.0\leq n_t\leq3.0$, it is preferable for the abovementioned ranges to be 3 nm$\leq L\leq40$ m or 60 nm$\leq L\leq130$ nm, and it is more preferable for the ranges to be 7 nm$\leq L\leq30$ nm or 65 nm$\leq L\leq120$ nm. By selecting an L within these ranges, both the transmittances $T_c$ and $T_a$ of first information layer 23 can be higher.

Oxides such as $TiO_2$, $ZrO_2$, $HfO_2$, $ZnO$, $Nb_2O_5$, $Ta_2O_5$, $SiO_2$, $Al_2O_3$, $Bi_2O_3$, $CeO_2$, $Cr_2O_3$, $Ga_2O_3$, Sr—O and the like can be used as the material for adjustable transmittance layer 209. Additionally, nitrides such as Ti—N, Zr—N, Nb—N, Ta—N, Si—N, Ge—N, Cr—N, Al—N, Ge—Si—N, Ge—Cr—N and the like can be used. Moreover, sulfides such as ZnS can be used. In addition, mixtures of the above materials can also be used. Among these, in particular $TiO_2$ and materials including $TiO_2$ are preferred. Since materials such as these have a higher refractive index (n=2.6 to 2.8), a small extinction coefficient (k=0.0 to 0.05), this also raises the transmittance of first information layer 23 higher.

In order to achieve the required quantity of laser light for the record/reproduce operations in the information layer on the side more distal than first information layer 23 from the laser beam 11 incident side, transmittances $T_a$ and $T_c$ of first information layer 23 should preferably satisfy the conditions $40 < T_c$ and $40 < T_a$, and more preferably satisfy the conditions $46 < T_c$ and $46 < T_a$.

Transmittances and $T_a$ and $T_c$ of first information layer 23 preferably satisfy the condition $-5 \leq (T_c - T_a) \leq 5$, and more preferably satisfy the condition $-3 \leq (T_c - T_a) \leq 3$. When $T_c$ and $T_a$ satisfy these conditions, there is a smaller effect of the change in transmittance due to the status of first recording layer 204 in first information layer 23 during record/reproduce operations of the information layer on the side more distal than first information layer 23 from the laser beam 11 incident side, and favorable record/reproduce characteristics are obtained.

In first information layer 23, for reflectance $R_{c1}$ (%) when first recording layer 204 is in a crystalline phase and reflectance $R_{a1}$ (%) when first recording layer 204 is in an amorphous phase, it is preferable if the condition $R_{a1} < R_{c1}$ is satisfied. When this is the case, the reflectance is high in the initial state when information has not been recorded, so that record/reproduce operations can be carried out in a stable manner. In addition, to obtain a larger reflectance difference ($R_{c1} - R_{a1}$) and favorable record/reproduce characteristics, it is preferable for $R_{c1}$ and $R_{a1}$ to satisfy $0.1 \leq R_{a1} \leq 5$ and $4 \leq R_{c1} \leq 15$, and it is more preferable for them to satisfy $0.1 \leq R_{a1} \leq 3$ and $4 \leq R_{c1} \leq 10$.

Information recording medium 22 can be manufactured by the method explained below.

First, N−1 layers are laminated sequentially over substrate 14 (for example, with a thickness of 1.1 mm) using information layers and optical separation layers. The information layer is constituted from a single-layer film or a multi-layer film, and such layers can be formed within a coating device through the use of sequential sputtering with a sputtering target constituted from the material. Additionally, the optical separation layers can be formed by applying a resin such as a photocurable resin (particularly an ultraviolet radiation-curable resin) or a slow-acting resin or the like over the information layer, after which substrate 14 is rotated so that the resin extends uniformly (spin coating) and then the resin is cured. Furthermore, when the optical separation layer is provided with a guide groove for laser beam 11, the guide groove can be formed by bonding a resin to a substrate (mold) that forms the groove prior to curing, followed by the mold covered with the substrate 14 being rotated to perform spin coating, and removing the substrate (mold) after the resin is cured.

After laminating N−1 layers over substrate 14 using information layers and optical separation layers, proceeding in this manner prepares for forming optical separation layer 17.

Next, first information layer 23 is formed over optical separation layer 17. Specifically, after first being laminated with N−1 layers using information layers and optical separation layers, substrate 14 with formed optical separation layer 17 is positioned within a coating device and a film of adjustable transmittance layer 209 is formed over optical separation layer 17. Adjustable transmittance layer 209 can be formed in substantially the same manner as for second dielectric layer 106 in Embodiment 1.

Next, a film of first reflective layer 208 is formed over adjustable transmittance layer 209. First reflective layer 208 can be formed in substantially the same manner as for second reflective layer 108 in Embodiment 1.

Next, depending on the requirements, a film of fourth dielectric layer 206 is formed over first reflective layer 208. Fourth dielectric layer 206 can be formed in substantially the same manner as for second dielectric layer 106 in Embodiment 1.

Next, a film of fourth interface layer 205 is formed over first reflective layer 208 or fourth dielectric layer 206. Fourth interface layer 205 can be formed in substantially the same manner as for second dielectric layer 106 in Embodiment 1.

Next, a film of first recording layer 204 is formed over fourth interface layer 205. First recording layer 204 can be formed in substantially the same manner as for recording layer 104 in Embodiment 1, by using a sputtering target that corresponds to its composition.

Next, a film of third interface layer 203 is formed over first recording layer 204. Third interface layer 203 can be formed in substantially the same manner as for second dielectric layer 106 in Embodiment 1.

Next, a film of third dielectric layer 202 is formed over third interface layer 203. Third dielectric layer 202 can be formed in substantially the same manner as for second dielectric layer 106 in Embodiment 1.

Finally, transparent layer 13 is formed over third dielectric layer 202. Transparent layer 13 is formed by the method explained in Embodiment 1.

Furthermore, after a film of third dielectric layer 202 is formed, or after transparent layer 13 is formed, depending on the requirements, it is also favorable to carry out an initialization process in which the entire first recording layer 204 is crystallized. The crystallization of first recording layer 204 can be carried out by irradiating with a laser beam.

Information recording medium 22 can be manufactured in the above manner. Furthermore, while a film of each of the layers is formed by using the sputtering method in the present embodiment, the embodiment is not limited to this method and it is also possible to use a vacuum deposition method, an ion plating method, a CVD method, an MBE method or the like.

Embodiment 3

Figure 3:
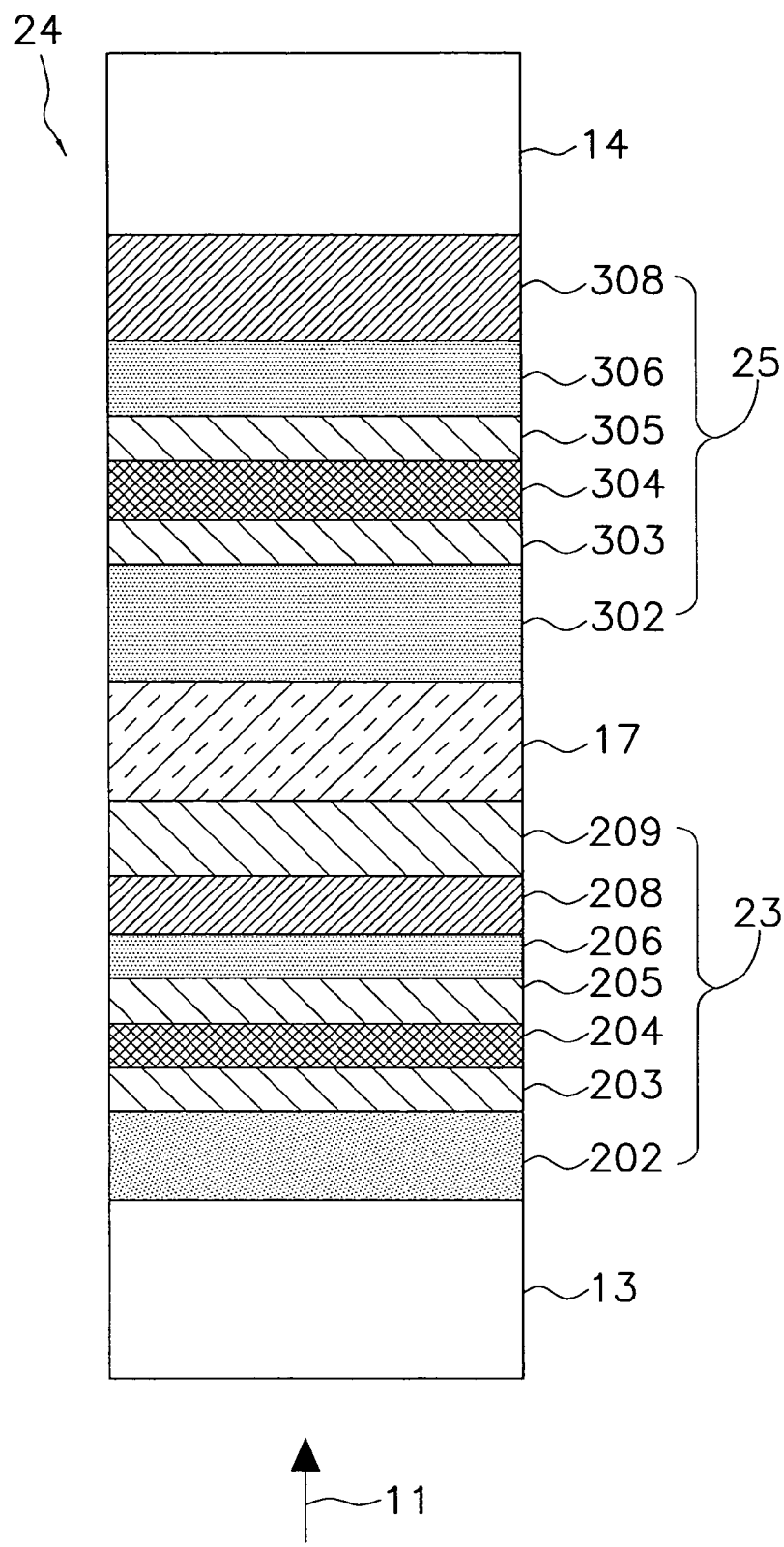
FIG. 3 is a partial cross-sectional diagram showing an example of a layer structure on an information recording medium comprising two information layers of the present invention.

In Embodiment 3, N=2 in the multilayer optical information recording medium of the present invention in Embodiment 2, in other words an example of an information recording medium that uses biphasic information layers is explained. A partial cross-sectional diagram of information recording medium 24 of Embodiment 3 is shown in FIG. 3. Information recording medium 24 is a bilayer optical information recording medium wherein it is possible to record and/or reproduce information by means of irradiating with laser beam 11 from one side.

Information recording medium 24 is constituted from second information layer 25, optical separation layer 17, first information layer 23 and transparent layer 13 that are sequentially laminated over substrate 14. Materials substantially the same as those in the explanations in Embodiments 1 and 2 can be used in substrate 14, optical separation layer 17, first information layer 23 and transparent layer 13. In addition, these will also have substantially the same form and function as was explained in Embodiments 1 and 2.

The constitution of information layer 25 is described below in detail.

Second information layer 25 is provided with first dielectric layer 302, first interface layer 303, second recording layer 304, second interface layer 305, second dielectric layer 306 and second reflecting layer 308, positioned in order from the laser beam 11 incident side. Record/reproduce operations can be carried out on second information layer 25 by using laser beam 11 that passes through transparent layer 13, first information layer 23 and optical separation layer 17.

Substantially the same materials as were used in first dielectric layer 102 of Embodiment 1 can be used in first dielectric layer 302. Additionally, the function of first dielectric layer 302 is substantially the same as for first dielectric layer 102 of Embodiment 1.

The film thickness of first dielectric layer 302 can be determined exactly according to a calculation based on the matrix method, so as to satisfy conditions that increase the change in the amount of reflected light between the crystalline phase and amorphous phase of second recording layer 304.

Substantially the same materials as were used for first interface layer 103 in Embodiment 1 can be used in first interface layer 303. Moreover, the function and form of the interface layer will also be substantially the same as was explained for first interface layer 103 in Embodiment 1.

Substantially the same materials as were used for second interface layer 105 in Embodiment 1 can be used in second interface layer 305. Moreover, the function and form of the interface layer will also be substantially the same as was explained for second interface layer 105 in Embodiment 1.

Substantially the same materials used in second dielectric layer 106 of Embodiment 1 can be used in second dielectric layer 306. Additionally, the function and form of the dielectric layer will also be substantially the same as for second dielectric layer 106 of Embodiment 1.

Second recording layer 304 can be formed from substantially the same materials as were used for recording layer 104 of Embodiment 1. In order for the recording sensitivity of second information layer 25 to be higher, the film thickness of second recording layer 304 is preferably within the range of 6 nm to 15 nm when the material of the recording layer undergoes a reversible phase-change (for example, $Ge_AM4_BTe_{3+A}$). Within this range, when second recording layer 304 is thick, the thermal effect on the adjacent region becomes higher due to the diffusion of the heat along the in-plane direction. In addition, when second recording layer 304 is thin, the reflectance of second information layer 25 becomes smaller. Consequently, the film thickness of second recording layer 304 is more preferably within the range of 8 nm to 13 nm. Additionally, when a material that undergoes an irreversible phase-change (for example, Te—Pd—O) is used for second recording layer 304 in substantially the same manner as in Embodiment 1, the film thickness of second recording layer 304 is preferably within the range of 10 nm to 40 nm.

Substantially the same materials as described for reflective layer 108 in Embodiment 1 can be used in second reflective layer 308. In addition, the function and form of the reflective layer will also be substantially the same as for reflective layer 108 of Embodiment 1.

It is satisfactory to position interface layer 307 (not shown) between second reflective layer 308 and second dielectric layer 306. Substantially the same materials as described for interface layer 107 in Embodiment 1 can be used in interface layer 307. Moreover, the function and form of the interface layer will also be substantially the same as for interface layer 107 of Embodiment 1.

Information recording medium 24 can be manufactured by the method explained below.

First, second information layer 25 is formed. Specifically, substrate 14 (for example, of thickness 1.1 mm) is first prepared and is positioned within a coating device.

Next, a film of second reflective layer 308 is formed over substrate 14. At this time, if a guide groove for the purpose of guiding laser beam 11 is to be formed, the film of second reflective layer 308 is formed on the side where the guide groove is formed. Second reflective layer 308 can be formed in substantially the same manner as for reflective layer 108 in Embodiment 1.

Next, depending on the requirements, a film of interface layer 307 is formed over second reflective layer 308. Interface layer 307 can be formed in substantially the same manner as for second dielectric layer 106 in Embodiment 1.

Next, a film of second dielectric layer 306 is formed over second reflective layer 308 or interface layer 307. Second dielectric layer 306 can be formed in substantially the same manner as for second dielectric layer 106 in Embodiment 1.

Next, depending on the requirements, a film of second interface layer 305 is formed over second reflective layer 308, interface layer 307 or second dielectric layer 306. Second interface layer 305 can be formed in substantially the same manner as for second dielectric layer 106 in Embodiment 1.

Next, a film of second recording layer 304 is formed over second dielectric layer 306 or second interface layer 305. Second recording layer 304 can be formed in substantially the same manner as for recording layer 104 in Embodiment 1, by using a sputtering target that corresponds to its composition.

Next, depending on the requirements, a film of first interface layer 303 is formed over second recording layer 304. First interface layer 303 can be formed in substantially the same manner as for second dielectric layer 106 in Embodiment 1.

Next, a film of first dielectric layer 302 is formed over second recording layer 304 or first interface layer 303. First dielectric layer 302 can be formed in substantially the same manner as for second dielectric layer 106 in Embodiment 1.

Second information layer 25 is formed in this manner.

Next, optical separation layer 17 is formed over first dielectric layer 302 of second information layer 25. Optical separation layer 17 can be formed over first dielectric layer 302 by applying a photocurable resin (particularly an ultraviolet radiation-curable resin) or a slow-acting resin as a spin coating, after which the resin is cured. Furthermore, when optical separation layer 17 is provided with a guide groove for laser beam 11, the guide groove can be formed by bonding resin to a substrate (mold) that forms the groove prior to curing, after which the resin is cured and then the substrate (mold) is taken up.

Moreover, after a film of second dielectric layer 302 is formed, or after optical separation layer 17 is formed, depending on the requirements it is also suitable to carry out an initialization process in which the entire second recording layer 304 is crystallized. The crystallization of second recording layer 304 can be carried out by irradiating with laser beam 11.

Next, first information layer 23 is formed over optical separation layer 17. Specifically, films of adjustable transmittance layer 209, first reflective layer 208, fourth interface layer 205, first recording layer 204, third interface layer 203 and third dielectric layer 202 are first formed in order over optical separation layer 17. At this time, depending on the requirements, a film of fourth dielectric layer 206 can be formed between first reflective layer 208 and fourth interface layer 205. Each of these layers can be formed by methods explained in Embodiment 2.

Finally, transparent layer 13 is formed over third dielectric layer 202. Transparent layer 13 is formed by the method explained in Embodiment 1.

Furthermore, after a film of third dielectric layer 202 is formed, or after transparent layer 13 is formed, depending on the requirements it is also favorable to carry out an initialization process in which the entire first recording layer 204 is crystallized. The crystallization of first recording layer 204 can be carried out by irradiating with a laser beam.

Additionally, after a film of third dielectric layer 202 is formed, or after transparent layer 13 is formed, depending on the requirements it is also favorable to carry out an initialization process in which the entire second recording layer 304 and first recording layer 204 are crystallized. In this case, if the crystallization of first recording layer 204 is carried out first, there is a tendency for the laser power required to crystallize second recording layer 304 to grow larger, so that it is preferable for second recording layer 304 to be crystallized first.

Information recording medium 24 can be manufactured in the above manner. Furthermore, while a film of each of the layers is formed by using the sputtering method in the present Embodiment, the Embodiment is not limited to this method and it is also possible to use a vacuum deposition method, an ion plating method, a CVD method, an MBE method or the like.

Embodiment 4

Figure 4:
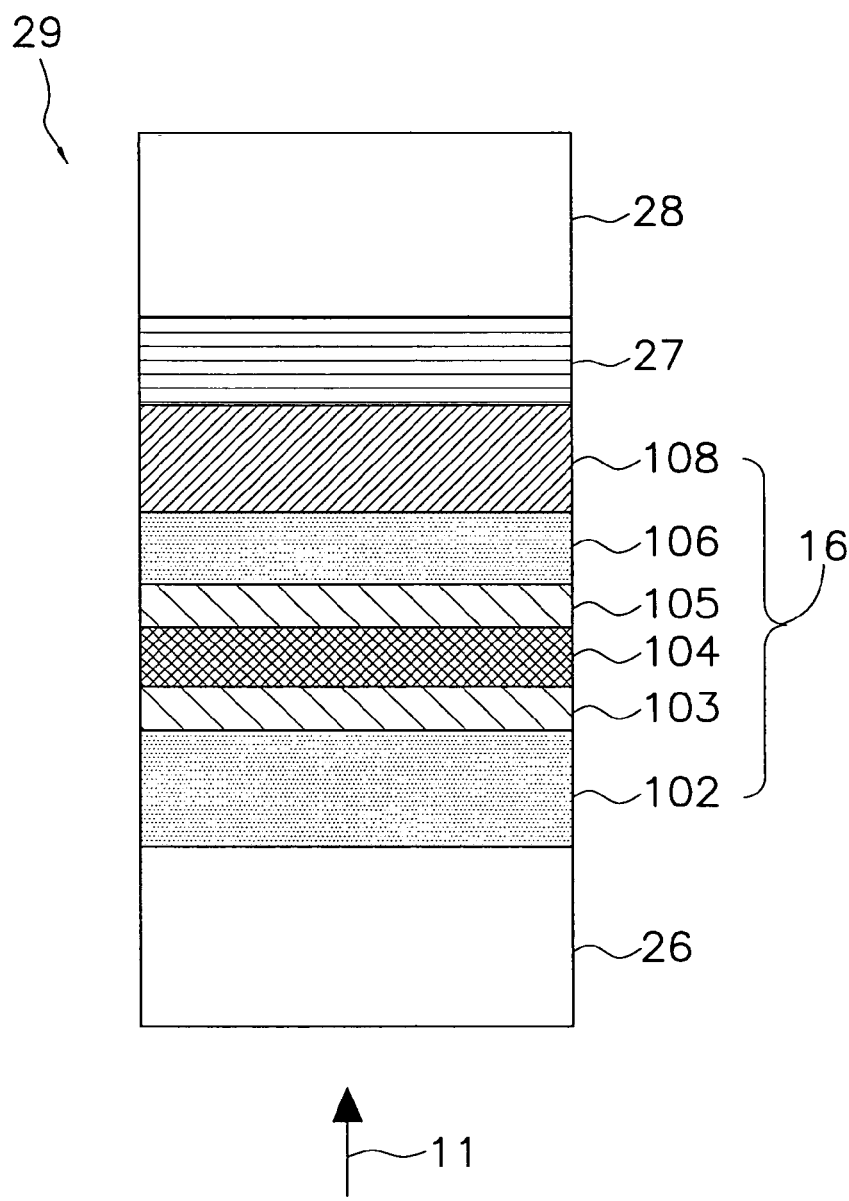
FIG. 4 is a partial cross-sectional diagram showing an example of a layer structure on an information recording medium comprising one information layer of the present invention.

An example of an information recording medium of the present invention is explained in Embodiment 4. A partial cross-sectional diagram of information recording medium 29 of Embodiment 4 is shown in FIG. 4. Information recording medium 29 is an optical information recording medium wherein it is possible to record and/or reproduce information by means of irradiating with laser beam 11 in substantially the same manner as for information recording medium 15 of Embodiment 1.

Information recording medium 29 is constituted from substrate 26 over which information layer 16 has been laminated and dummy substrate 28, where these are bonded together through adhesive layer 27.

Substrate 26 and dummy substrate 28 are transparent disk-shaped plates. Resins such as polycarbonate or amorphous polyolefin or PMMA or the like, or glass or the like can be used in substrate 26 and dummy substrate 28, in substantially the same manner as for substrate 14 in Embodiment 1.

Depending on the requirements, a guide groove for guiding a laser beam can be formed on the surface of the first dielectric layer 102 side of substrate 26. It is preferable for the surfaces of the first dielectric layer 102 side and opposite side of substrate 26, and the surfaces of the adhesive layer side and the opposite side of dummy substrate 28, to be smooth. For the material of substrate 26 and dummy substrate 28, polycarbonate is particularly useful from the perspective of superior transcribability, mass producibility and low cost. Furthermore, for having adequate strength and giving an information recording medium with a thickness on the order of 1.2 mm, the thickness of substrate 26 and dummy substrate 28 is preferably within the range of 0.3 mm to 0.9 mm.

Adhesive layer 27 is constituted from a resin such as a photocurable resin (particularly an ultraviolet radiation-curable resin) or a slow-acting resin that preferably has low light absorption for laser beam 11 that is used, and preferably has low optical birefringence in the short-wavelength region. Furthermore, based on substantially the same reasoning as for optical separation layers 19 and 17, the thickness of adhesive layer 27 is preferably within the range of 0.6 µm to 50 µm.

In addition, where a component is identified by the same symbol as was used in Embodiment 1, it will be omitted from the explanation.

Information recording medium 29 can be manufactured by the method explained below.

First, information layer 16 is formed over substrate 26 (of thickness 0.6 mm, for example). At this time, if a guide groove for the purpose of guiding laser beam 11 is to be formed in substrate 26, information layer 16 is formed on the side where the guide groove is formed. Specifically, substrate 26 is positioned within a coating device, and first dielectric layer 102, first interface layer 103, recording layer 104, second interface layer 105, second dielectric layer 106 and reflective layer 108 are laminated on sequentially. Furthermore, depending on the requirements, a film of interface layer 107 (not shown) is formed between second dielectric layer 106 and reflective layer 108. The methods for forming the films of the various layers are substantially the same as in Embodiment 1.

Next, substrate 26 with laminated information layer 16 and dummy substrate 28 (for example, of thickness 0.6 mm) are bonded together using adhesive layer 27. Specifically, a resin such as a photocurable resin (particularly an ultraviolet radiation-curable resin) or a slow-acting resin is applied to dummy substrate 28, and after dummy substrate 28 with the adhering spin coating is bonded to substrate 26 with laminated information layer 16, the resin can be cured. Moreover, an adhesive resin is uniformly applied over dummy substrate 28 beforehand, so that this can be bonded to substrate 26 with laminated information layer 16.

Furthermore, after substrate 26 and dummy substrate 28 are bonded together, depending on the requirements, an initialization process can be carried out in which the entire recording layer 104 is crystallized. The crystallization of recording layer 104 can be carried out by irradiating with a laser beam.

Information recording medium 29 can be manufactured in the above manner. Furthermore, while a film of each of the layers is formed by using the sputtering method in the present embodiment, the embodiment is not limited to this method and it is also possible to use a vacuum deposition method, an ion plating method, a CVD method, an MBE method or the like.

Embodiment 5

Figure 5:
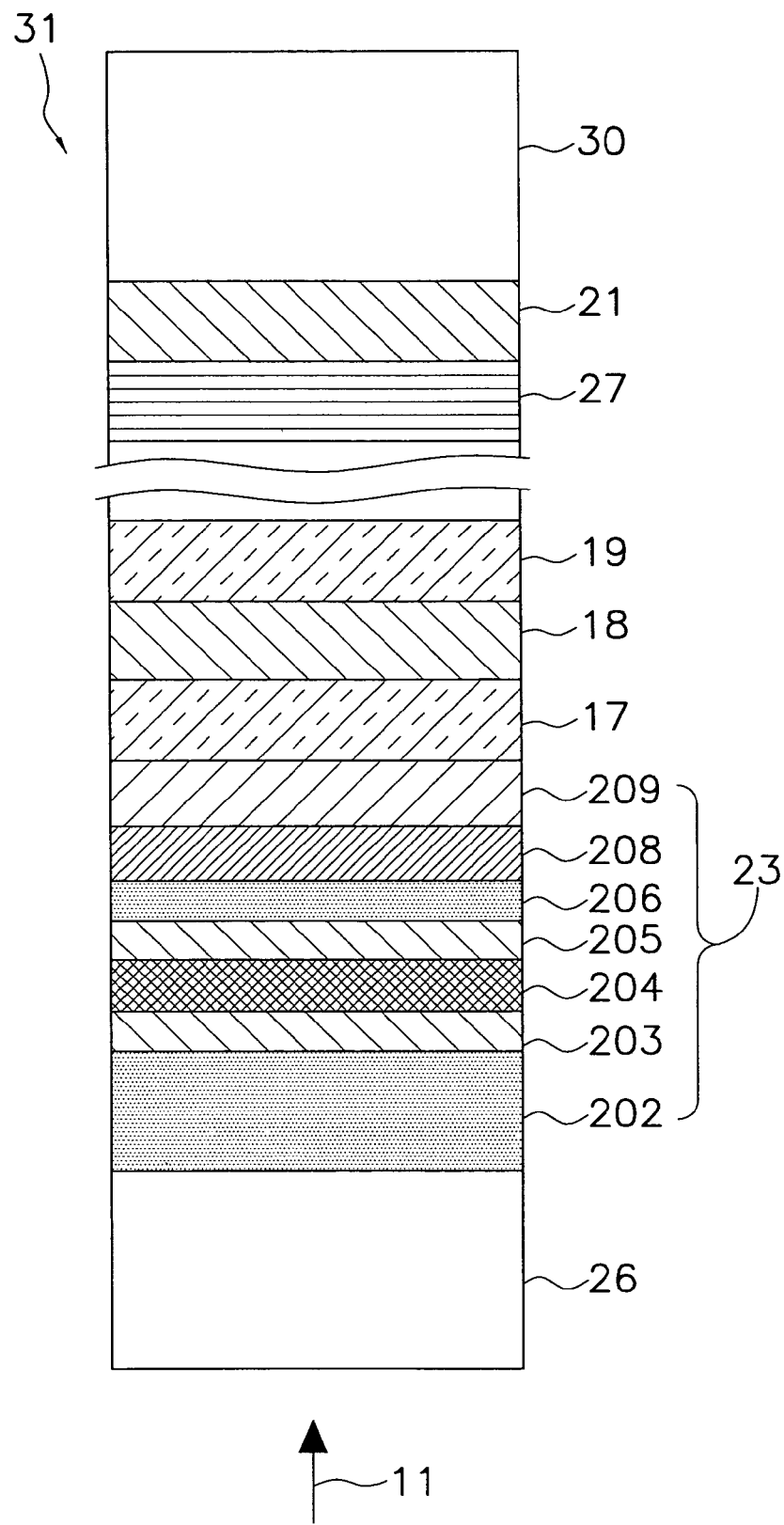
FIG. 5 is a partial cross-sectional diagram showing an example of a layer structure on an information recording medium comprising N information layers of the present invention.

An example of an information recording medium of the present invention is explained in Embodiment 5. A partial cross-sectional diagram of information recording medium 31 of Embodiment 5 is shown in FIG. 5. Information recording medium 31 is a multilayer optical information recording medium wherein it is possible to record and/or reproduce information by means of irradiating with laser beam 11 from one side in substantially the same manner as for information recording medium 22 of Embodiment 2.

Information recording medium 31 is constituted from N phases of first information layer 23 and information layer 18 sequentially laminated with optical separation layers 17, 19 and the like over substrate 26 and information layer 21 laminated over substrate 30 that are bonded together through adhesive layer 27.

Substrate 30 is a transparent, disk-shaped substrate. In substantially the same manner as for substrate 14, for example, polycarbonate or amorphous polyolefin or PMMA or the like, or glass or the like can be used in substrate 30.

Depending on the requirements, a guide groove for guiding the laser beam can be formed in the surface of the information layer 21 side of substrate 30. It is preferable for the surfaces of the information layer 21 side and the opposite side of substrate 30 to be smooth. For the material of substrate 30, polycarbonate is particularly useful from the perspective of superior transcribability, mass producibility and low cost. Furthermore, from the perspective of having adequate strength and for the thickness of information recording medium 31 to be on the order of 1.2 mm, a thickness for substrate 30 in the range of 0.3 mm to 0.8 mm is preferred.

In addition, where a component is identified by the same symbol as was used in Embodiments 2 and 4, it will be omitted from the explanation.

Information recording medium 31 can be manufactured by the method explained below.

First information layer 23 is first formed over substrate 26 (of thickness 0.6 mm, for example). At this time, if a guide groove for the purpose of guiding laser beam 11 is to be formed in substrate 26, first information layer 23 is formed on the side where the guide groove is formed. Specifically, substrate 26 is positioned within a coating device, and third dielectric layer 202, third interface layer 203, first recording layer 204, fourth interface layer 205, first reflective layer 208 and adjustable transmittance layer 209 are laminated on sequentially. Furthermore, depending on the requirements, a film of fourth dielectric layer 206 can be formed between fourth interface layer 205 and first reflective layer 208. The methods for forming the films of the various layers are substantially the same as in Embodiment 2. Later N−2 layers of information layers and optical separation layers are laminated on sequentially.

Additionally, information layer 21 is formed over substrate 30 (of thickness 0.6 mm, for example). The information layer is constituted from a single-layer film or a multi-layer film, and such layers can be formed substantially as in Embodiment 2, within a coating device through the use of sequential sputtering with a sputtering target composed of the material.

Finally, substrate 26 with a laminated information layer and substrate 30 are bonded together through adhesive layer 27. Specifically, a resin such as a photocurable resin (particularly an ultraviolet radiation-curable resin) or a slow-acting resin is applied over information layer 21, and after the spin coating adhering over information layer 21 is bonded to substrate 26 having a film of information layer 23 formed thereon, the resin can be cured. Additionally, an adhesive resin was uniformly applied over information layer 21 beforehand, so that this can be bonded to substrate 26.

Moreover, after substrate 26 and substrate 30 are bonded together, depending on the requirements, an initialization process can be carried out in which the entire first recording layer 204 is crystallized. The crystallization of first recording layer 204 can be carried out by irradiating with a laser beam.

Information recording medium 31 can be manufactured in the above manner. Furthermore, while a film of each of the layers is formed by using the sputtering method in the present embodiment, the embodiment is not limited to this method and it is also possible to use a vacuum deposition method, an ion plating method, a CVD method, an MBE method or the like.

Embodiment 6

Figure 6:
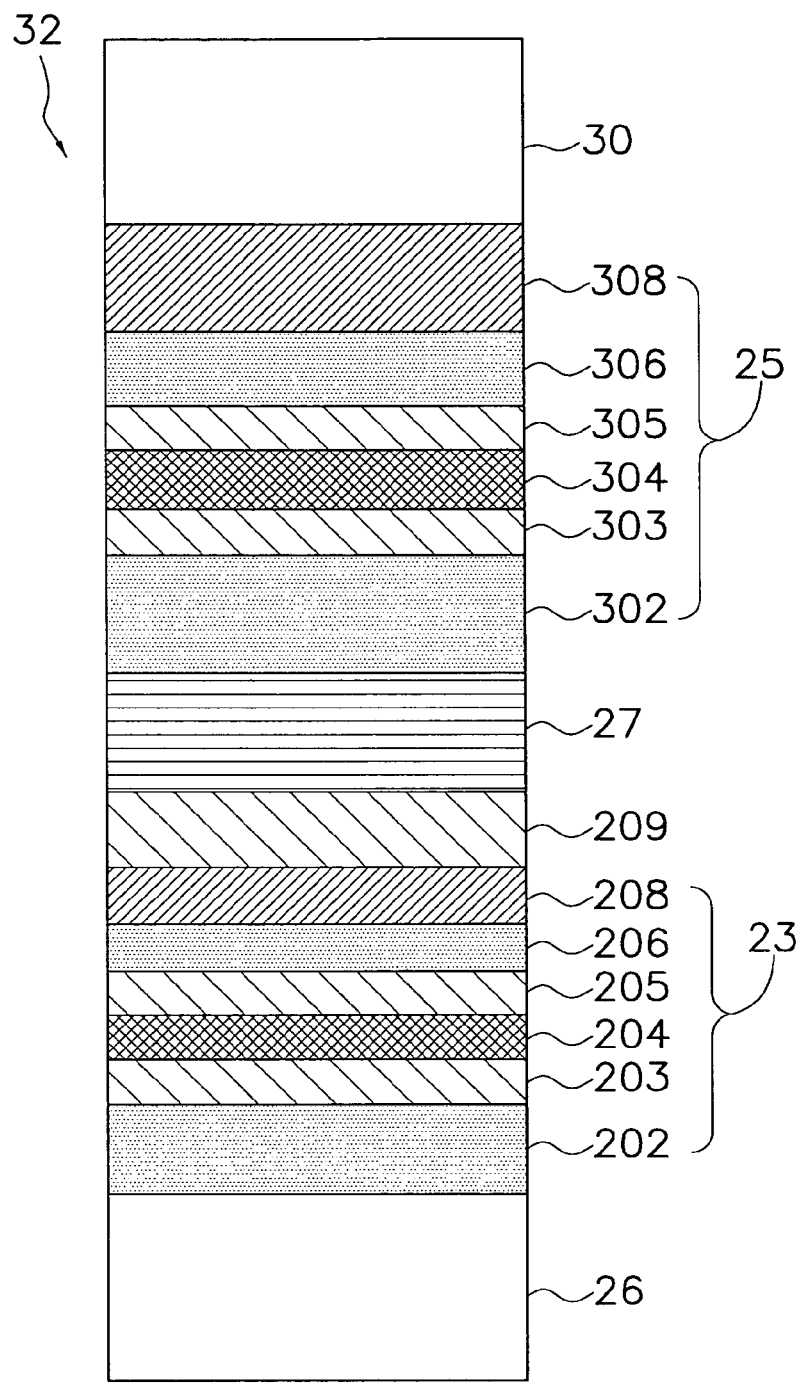
FIG. 6 is a partial cross-sectional diagram showing an example of a layer structure on an information recording medium comprising two information layers of the present invention.

In Embodiment 6, N = 2 in the multilayer optical information recording medium of the present invention in Embodiment 5, in other words an example of an information recording medium constituted from biphasic information layers is explained. A partial cross-sectional diagram of information recording medium 32 of Embodiment 6 is shown in FIG. 6. Information recording medium 32 is a bilayer optical information recording medium wherein it is possible to record and/or reproduce information by means of irradiating with laser beam 11 from one side in substantially the same manner as for information recording medium 24 of Embodiment 3.

Information recording medium 32 is constituted from first information layer 23 on substrate 26 and second information layer 25 on substrate 30 bonded together through adhesive layer 27.

Depending on the requirements, a guide groove for guiding a laser beam can be formed on the surface of the second reflecting layer 308 side of substrate 30. It is preferable for the surfaces of the second reflecting layer 308 side and the opposite side of substrate 30 to be smooth.

In addition, where a component is identified by the same symbol as was used in Embodiment 3, Embodiment 4 and Embodiment 5, it will be omitted from the explanation.

Information recording medium 32 can be manufactured by the method explained below.

First information layer 23 is first formed over substrate 26 (of thickness 0.6 mm, for example) in substantially the same manner as in Embodiment 5.

Furthermore, after a film of adjustable transmittance layer 209 is formed, depending on the requirements, an initialization process can be carried out in which the entire first recording layer 204 is crystallized. The crystallization of first recording layer 204 can be carried out by irradiating with a laser beam.

Additionally, second information layer 25 is formed over substrate 30 (of thickness 0.6 mm, for example). At this time, if a guide groove for the purpose of guiding laser beam 11 is to be formed, second reflective layer 25 is formed on the side where the guide groove is formed. Specifically, substrate 30 is positioned within a coating device, and second reflective layer 308, second dielectric layer 306, second interface layer 305, second recording layer 304, first interface layer 303, and first dielectric layer 302 are laminated on sequentially. Moreover, depending on the requirements, a film of interface layer 307 (not shown) can be formed between second reflective layer 308 and second dielectric layer 306. The methods for forming the films of the various layers are substantially the same as in Embodiment 3.

Furthermore, after a film of first dielectric layer 302 is formed, depending on the requirements, an initialization process can be carried out in which the entire second recording layer 304 is crystallized. The crystallization of second recording layer 304 can be carried out by irradiating with laser beam 11.

Finally, substrate 26 laminated with first information layer 23 and substrate 30 laminated with second information layer 25 are bonded together through adhesive layer 27. Specifically, a resin such as a photocurable resin (particularly an ultraviolet radiation-curable resin) or a slow-acting resin is applied over first information layer 23 or second information layer 25, and after substrate 26 and substrate 30 have been bonded together and spin coated, the resin can be cured. Moreover, an adhesive resin can be uniformly applied over first information layer 23 or second information layer 25 beforehand, and substrate 26 and substrate 30 can be bonded together.

In addition, depending on the requirements, an initialization process can be carried out in which the entire second recording layer 304 and first recording layer 204 are crystallized. In this case, based on substantially the same reasoning as in Embodiment 3, it is preferable for second recording layer 304 to be crystallized first.

Information recording medium 32 can be manufactured in the above manner. Furthermore, while a film of each of the layers is formed by using the sputtering method in the present Embodiment, the Embodiment is not limited to this method and it is also possible to use a vacuum deposition method, an ion plating method, a CVD method, an MBE method or the like.

Embodiment 7

The record/reproduce methods for the information recording media of the present invention explained in Embodiments 1, 2, 3, 4, 5 and 6 are explained in Embodiment 7.

Figure 7:
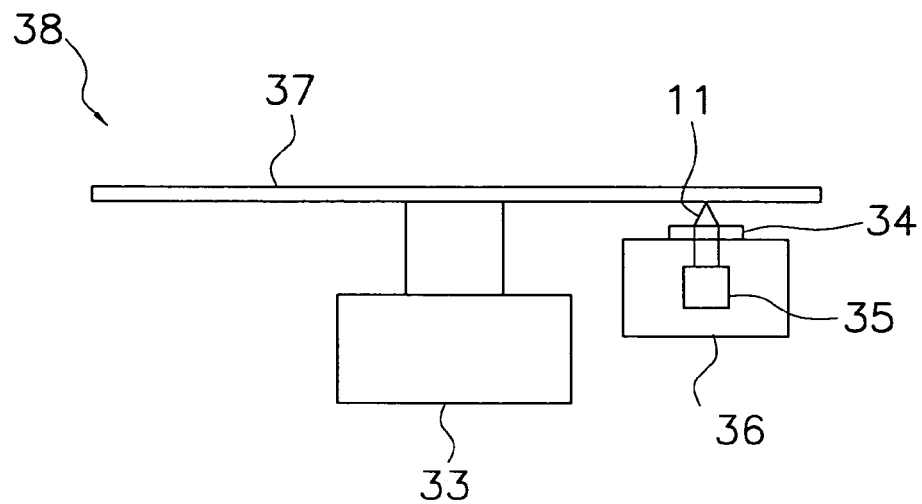
FIG. 7 is a pattern diagram showing a portion of a structure of a record/reproduce device used for record/reproduce of an information recording medium of the present invention.

A portion of the constitution of record/reproduce device 38 used in the record/reproduce methods of the present invention is shown schematically in FIG. 7. Referring to FIG. 7, record/reproduce device 38 is provided with optical head 36 that is equipped with spindle motor 33 for rotating information recording device 37, semiconductor laser 35 and objective lens 34 for focusing laser beam 11 that is output from semiconductor laser 35. Information recording medium 37 is the information recording medium explained in Embodiments 1, 2, 3, 4, 5 and 6, and is provided with single information layers (for example, information layer 16) or multiple information layers (for example, first information layer 23, second information layer 25). Objective lens 34 focuses laser beam 11 on an information layer.

The recording, erasing and overwriting of information on the information recording medium is carried out by modulating the power of laser beam 11, with a high power peak power ($P_p$(mW)) and a low power bias power ($P_b$(mW)). By irradiating with laser beam 11 at peak power, an amorphous phase is formed in a localized portion of the recording layer, and this amorphous phase becomes the recording mark. Between recording marks, irradiation at the bias power of laser beam 11 forms a crystalline phase (erased portion). Furthermore, irradiation with laser beam 11 at peak power forms a pulse sequence, which is generally referred to as a multipulse. Furthermore, the multipulse can only be modulated to the peak power and bias power levels, and power that is lower than bias power becomes cooling power ($P_c$(mW)) or bottom power ($P_B$(mW)), so that there are 3 or 4 modulation values for the power level in the range from 0 mW to peak power. Additionally, at power level lowers than peak power and bias power there will be no effect on the optical functioning of the recording mark due to irradiation by laser beam 11, while the power obtained as a sufficient quantity of reflected light in order to reproduce the recording marks from the information recording medium is the reproducing power ($P_r$(mW)), and by reproducing the signal in a detector from the information recording medium obtained by irradiating with laser beam 11 at reproducing power, reproducing of the information signal can be performed.

In order adjust the laser beam spot diameter within the range of 0.4 μm to 0.7 μm, the numerical aperture (NA) of objective lens 34 is preferably within the range of 0.5 to 1.1, more preferably within the range of 0.6 to 0.9. The wavelength of laser beam 11 is preferably 450 nm, and more preferably in the range of 350 nm to 450 nm. For the crystallization not to occur readily using the reproducing light and to obtain adequate erasure performance, the linear information recording speed for the information recording medium is preferably within the range of 1 m/sec to 20 m/sec, and more preferably within the range of 2 m/sec to 15 m/sec.

For information recording media 24 and 32 that are provided with two information layers, the focal point of laser beam 11 contacts first recording layer 204 when recording onto first information layer 23, and information is recorded to first recording layer 204 with laser beam 11 passing through transparent layer 13. Reproducing is carried out by using laser beam 11 that is reflected by first recording layer 204 and passes through transparent layer 13. When recording to second information layer 25, the focal point of laser beam 11 contacts second recording layer 304, and information is recorded with laser beam 11 passing through transparent layer 1, first information layer 23, and optical separation layer 17. Reproducing is carried out by using laser beam 11 that is reflected by second recording layer 304 and passes through optical separation layer 17, first information layer 23 and transparent layer 13.

Furthermore, when a guide groove for guiding laser beam 11 is formed in substrate 14, or optical separation layers 20, 19 or 17, information can be recorded on the side of the surface groove proximal to the laser beam 11 incident side (groove) or on the distal side of the surface groove (land). Additionally, information can be recorded on both the groove and the land.

For the recording capability, the power of laser beam 11 is modulated between 0 to $P_p$(mW), and in the (1-7) modulation method, random signals from a mark length of 0.149 μm (2 T) to 0.596 μm (8 T) are recorded, and recording mark front end and tail end jitter (mark position error) can be evaluated by measuring with a time interval analyzer. Here, the smaller the jitter value, the better recording performance. Moreover, $P_p$ and $P_b$ determined the minimization of the average values for the front end and tail end jitter (average jitter). This gives the $P_p$ most suitable for recording sensitivity.

In addition, with the power of laser beam 11 modulated between 0 and $P_p$(mW), the signals for mark lengths of 0.149 μm (2 T) and 0.671 μm (9 T) were recorded continuously through ten cycles of alternation in the same groove, and when the final 2 T signal was overwritten, the ratio of the signal amplitude to the noise amplitude (Carrier to Noise Ratio, CNR) for the 2 T signal frequency was measured with a spectrum analyzer to evaluate the signal strength. Here, the larger the CNR, the greater the signal strength.

Furthermore, the repeat overwrite cycle number was evaluated, with the power of laser beam 11 modulated between 0 and $P_p$(mW), random signals for mark lengths from 0.149 μm (2 T) to 0.596 μm (8 T) were recorded continuously, and in each recorded overwrite cycle the front end and tail end jitter were measured with a time interval analyzer. The upper limiting value for the repeat overwriting cycle number was a 3% increase with respect to the front end and tail end average jitter values over one cycle. Here, the $P_p$, $P_b$, $P_c$ and $P_B$ determined how the average jitter values were minimized.

Embodiment 8

Figure 8:
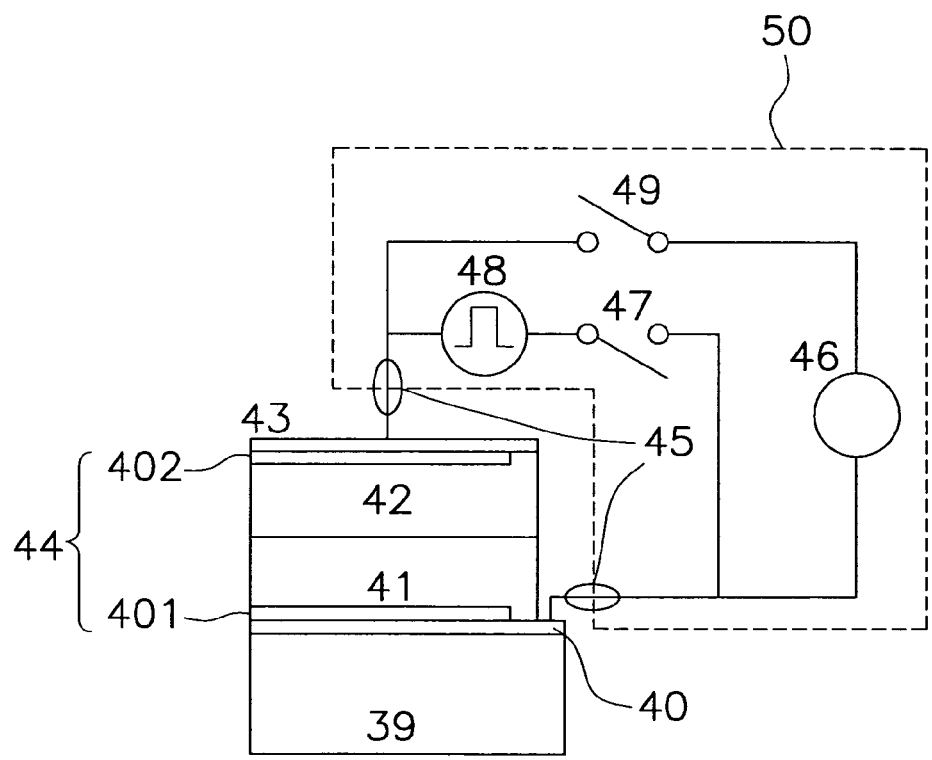
FIG. 8 is a pattern diagram showing portions of structures of an information recording medium and an electrical information record/reproduce device of the present invention.

An example of an information recording medium of the present invention is explained in Embodiment 8. One example of a configuration for an electrical information recording medium 44 of Embodiment 8 is shown in FIG. 8. Electrical information recording medium 44 is an information recording medium wherein it is possible to record and/or reproduce information by means of applying electrical energy, particularly an electric current.

A resin substrate such as of polycarbonate and the like, a glass substrate, a ceramic substrate such as of $Al_2O_3$ and the like, various semiconductor substrates such as of Si, and various metal substrates such as of Cu can be used for substrate 39. The case of an Si substrate will be explained here. Electrical information recording medium 44 is constituted by sequential lamination of lower electrode 40, first dielectric layer 401, first recording layer 41, second recording layer 42, second dielectric layer 402 and upper electrode 43. Lower electrode 40 and upper electrode 43 are formed in order to apply an electric current to first recording layer 41 and second recording layer 42. Here, first dielectric layer 401 is established to regulate the amount of electrical energy that is applied to first recording layer 41, and second dielectric layer 402 is established to regulate the amount of electrical energy that is applied to second recording layer 42.

Substantially the same materials used in second dielectric layer 106 of Embodiment 1 can be used in first dielectric layer 401 and second dielectric layer 402.

Materials that undergo a reversible phase-change between the crystalline phase and the amorphous phase by means of Joule heating generated by the application of electrical current are used in first recording layer 41 and second recording layer 42, where the phenomenon of a change in electrical resistance between the crystalline phase and the amorphous phase is utilized to record information. The material used for first recording layer 41 can be substantially the same as that of first recording layer 204 of Embodiment 2, and the material used for second recording layer 42 can be substantially the same as that of second recording layer 304 of Embodiment 3.

First recording layer 41 and second recording layer 42 can be formed in substantially the same manner as first recording layer 204 of Embodiment 2 and second recording layer 304 of Embodiment 3, respectively.

In addition, simple metal materials such as Al, Au, Ag, Cu and Pt can be used for lower electrode 40 and upper electrode 43, as well as alloy materials that have one or a plurality of elements from among these as the chief components to which have been added one or a plurality of other elements that are suitable for increasing the moisture resistance as well as regulating the thermal conductivity or the like. Lower electrode 40 and upper electrode 43 can be formed under an Ar gas atmosphere by sputtering from a material that is a base metal or a base alloy. Here, the method used for forming the various layers can be a vacuum deposition method, an ion plating method, a CVD method, an MBE method or the like.

Electrical information recording medium 44 is electrically connected to electrical information record/reproduce device 50 through application unit 45. This electrical information record/reproduce device 50 is connected to pulse power source 48 by means of switch 47 in order to apply an electrical current pulse between lower electrode 40 and upper electrode 43 to first recording layer 41 and second recording layer 42. Additionally, in order to detect the resistance value due to the phase-changes in first recording layer 41 and second recording layer 42, resistance meter 46 is connected via switch 49 between lower electrode 40 and upper electrode 43. In order to change first recording layer 41 and second recording layer 42 from the amorphous phase (high resistance state) to the crystalline phase (low resistance state), switch 47 is closed (switch 49 is opened) to apply an electrical current pulse between the electrodes, and the temperature of the portion receiving the electrical current pulse will be higher than the crystallization temperature of the material and lower than the melting point, so that the crystallization time interval can be maintained. On returning from the crystalline phase to become amorphous again, an electrical current pulse that is relatively higher than during crystallization is applied for a shorter time, the temperature of the recording layer rises higher than the melting point and melts, after which it quickly cools. Furthermore, pulse power source 48 for electrical information record/reproduce device 50 can output the recording/erasing pulse waveforms shown in FIG. 11.

Here, the resistance value when first recording layer 41 is in the amorphous phase is $r_{a1}$, the resistance value when first recording layer 41 is in the crystalline phase is $r_{c1}$, the resistance value when second recording layer 42 is in the amorphous phase is $r_{a2}$, and the resistance value when second recording layer 42 is in the crystalline phase is $r_{c2}$. Here, with $r_{c1} \leq r_{c2} < r_{a1} < r_{a2}$ or $r_{c1} \leq r_{c2} < r_{a2} < r_{a1}$ or $r_{c2} \leq r_{c1} < r_{a1} < r_{a2}$ or $r_{c2} \leq r_{c1} < r_{a2} < r_{a1}$, four different values can be determined for the sums of the resistance values for first recording layer 41 and second recording layer 42, $r_{a1}+r_{a2}$, $r_{a1}+r_{c2}$, $r_{a2}+r_{c1}$ and $r_{c1}+r_{c2}$. Consequently, by measuring the resistance value for the electrode gap with resistance meter 46, four different statuses and thus two information values can be detected at one time.

Figure 9:
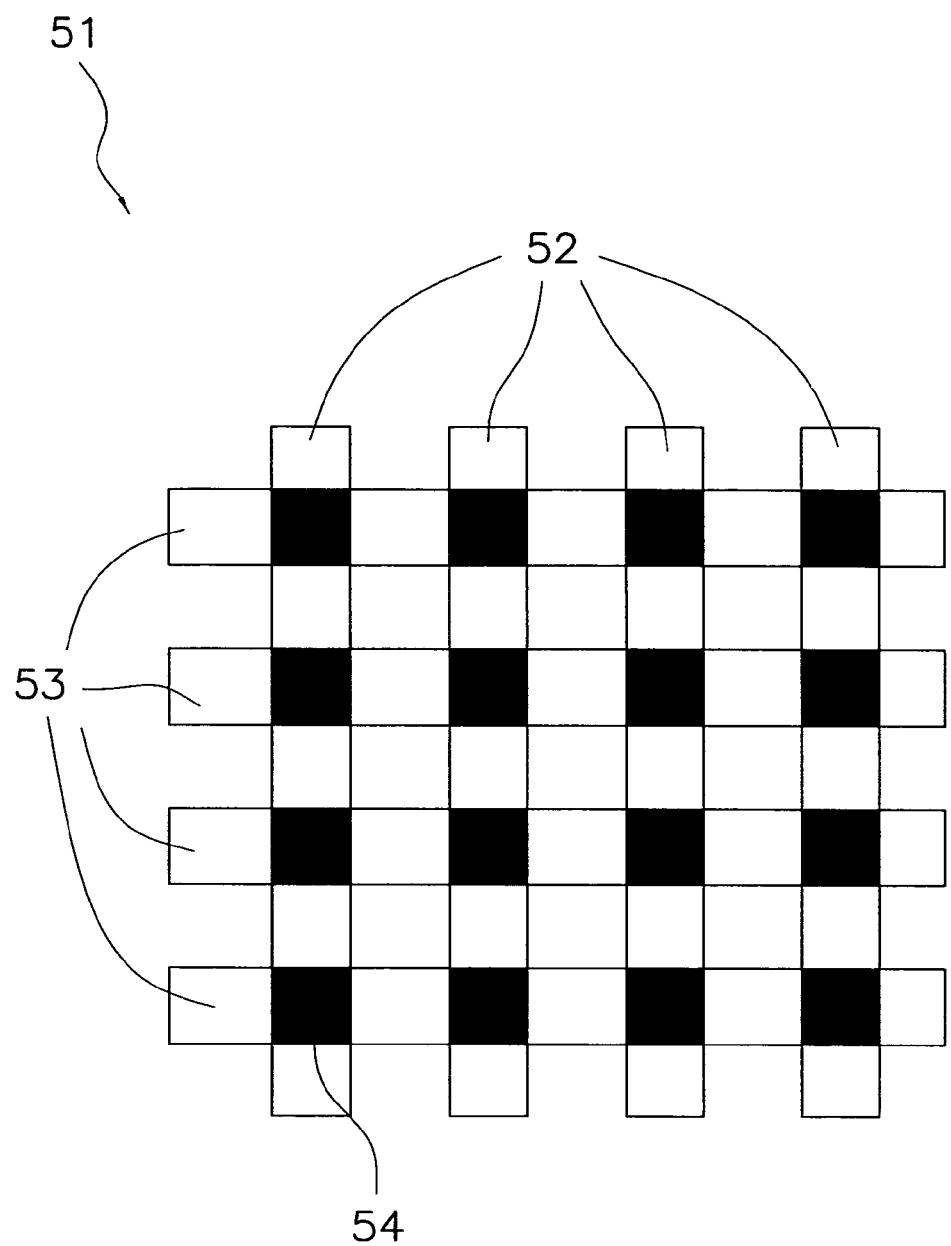
FIG. 9 is a pattern diagram showing a portion of a structure of a high capacity electrical information recording medium of the present invention.

As shown in FIG. 9, a high capacity electrical information recording medium 51 that is constituted from a plural arrangement of these electrical information recording media 44 in a matrix. In each memory cell 54, a configuration substantially the same as electrical information recording medium 44 is formed in a microscopic region. Information record/reproduce operations can be carried out in the various memory cells by designating one of them by the respective word line 52 and pit line 53.

Figure 10:
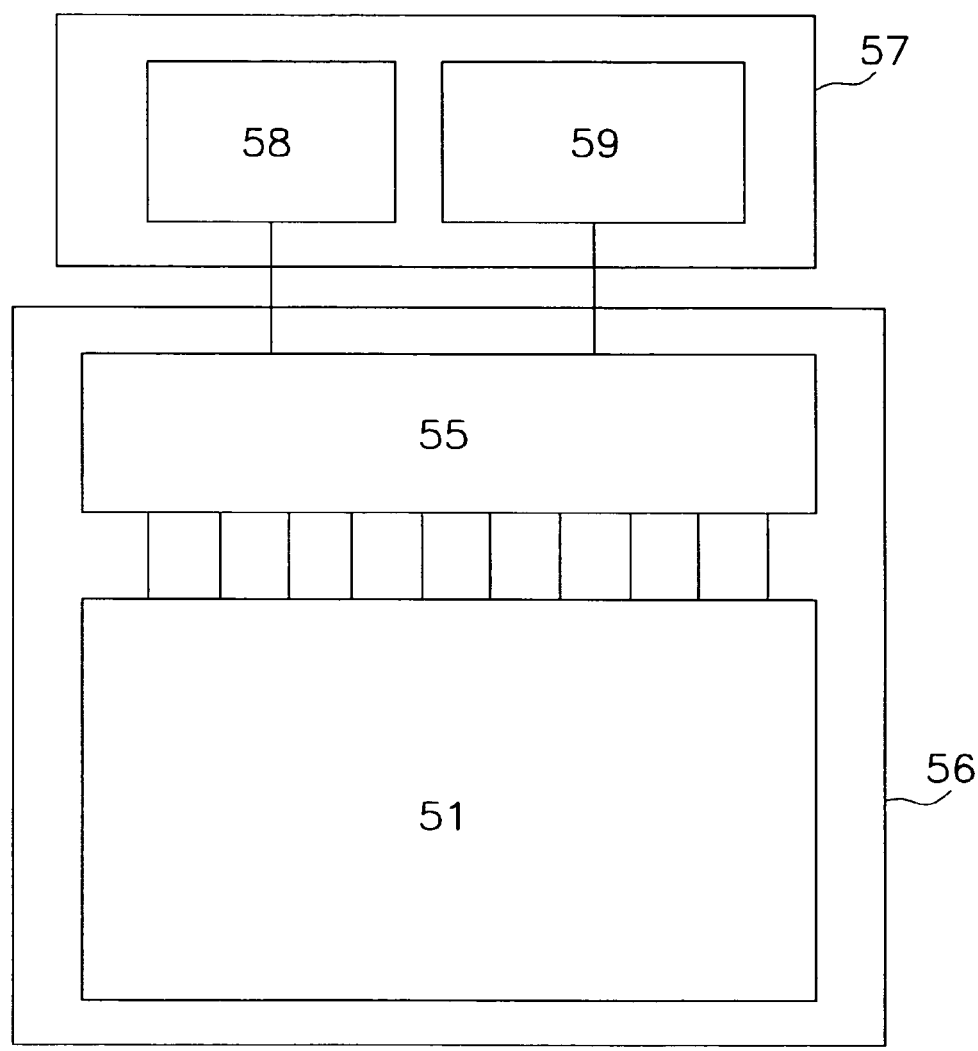
FIG. 10 is a pattern diagram showing portions of structures of an electrical information recording medium and a record/reproduce system of the medium of the present invention.

Electrical information recording medium 51 is used in FIG. 10, which shows a configuration example of an information recording system. Storage device 56 is constituted from electrical information recording medium 51 and address indicator circuit 55. By means of address indicator circuit 55, word line 52 and pit line 53 of electrical information recording medium 51 are indicated respectively, and information record/reproduce operations can be carried out in each of the memory cells 54. Moreover, by means of an electrical connection from storage device 56 to external circuit 57 that is constituted by at least pulse power source 58 and resistance meter 59, information record/reproduce operations can be carried out to electrical information recording medium 51.

EXAMPLES

Specific modes to implement the present invention are explained in detail by using examples.

Example 1

In Example 1, information recording medium 15 of FIG. 1 was constructed and was examined with respect to the material of second dielectric layer 106, the recording sensitivity and the repeat overwriting capability of information layer 16. Specifically, samples of information recording media that include information layers 16 with different materials for second dielectric layers 106 were constructed, and the recording sensitivity and the repeat overwriting capability of information layers 16 were measured.

The samples were manufactured as described below. First, for substrate 14, polycarbonate substrates (diameter 120 mm, thickness 1.1 mm) were prepared and a guide groove (depth 20 nm, track pitch 0.32 μm) was formed for guiding laser beam 11. Next, the following were laminated on this polycarbonate substrate by the sequential sputtering method: an Ag—Pd—Cu layer (thickness: 80 nm) as reflective layer 108, second dielectric layer 106 (thickness: 10-20 nm), a $Ge_{28}Sn_3Bi_2Te_{34}$ layer (thickness: 10 nm) as recording layer 104, a $(ZrO_2)_{50}(Cr_2O_3)_{50}$ layer (thickness: 5 nm) as first interface layer 103, and a $(ZnS)_{80}(SiO_2)_{20}$ layer (thickness: 60 nm) as first dielectric layer 102.

Finally, an ultraviolet radiation-curable resin was applied over first dielectric layer 102, and after a uniform resin layer was formed by bonding polycarbonate (diameter 120 mm, thickness 90 μm) to first dielectric layer 102 and rotating, a 100 μm thick transparent layer 13 was formed by curing the resin with ultraviolet radiation. Later, an initialization process was carried out in which recording layer 104 was crystallized with a laser beam. As mentioned above, a plurality of samples of different materials for second dielectric layer 106 were manufactured.

With the samples obtained in this manner, the recording sensitivity of information layer 16 of information recording medium 15 and the repeat overwriting capability were tested using the record/reproduce device 38 in FIG. 7. In this case, the wavelength of laser beam 11 was 405 nm, numerical aperture (NA) of objective lens 34 was 0.85, the sample linear speeds during measurement were 4.9 m/sec and 9.8 m/sec, and the shortest mark length (2 T) was 0.149 μm. Additionally, the information was recorded on the groove.

Results are shown for the evaluation of materials of second dielectric layer 106 of information layer 16 of information recording medium 15, and the recording sensitivity and the repeat overwriting capability of information layer 16, in Table 1 for the linear speed of 4.9 m/sec (1X) and in Table 2 for the linear speed of 9.8 m/sec (2X). Here, for the recording sensitivity at 1X, <6 mW is indicated by O, ≧6 mW and <7 mW is indicated by Δ, and ≧7 mW is indicated by X. Moreover, for the recording sensitivity at 2X, <7 mW is indicated by O, ≧7 mW and <8 mW is indicated by Δ, and ≧8 mW is indicated by X. Also, for the repeat overwriting capability, a repeat overwriting cycle number of ≧1000 is indicated by O, a ≧500 but <1000 is indicated by Δ, and ≦500 is indicated by X.

TABLE 1

| Sample No. | Material for 2$^{nd}$ Dielectric Layer 106 | Recording sensitivity | Repeat overwriting capability |
|---|---|---|---|
| 1-1 | $(ZnS)_{80}(SiO_2)_{20}$ | O | X |
| 1-2 | $Dy_2O_3$ | O | O |
| 1-3 | $(Dy_2O_3)_{95}(Y_2O_3)_5$ | O | O |
| 1-4 | $(Dy_2O_3)_{95}(ZrO_2)_5$ | O | O |
| 1-5 | $(Dy_2O_3)_{50}(ZrO_2)_{50}$ | O | O |
| 1-6 | $(Dy_2O_3)_{50}(Y_2O_3)_5(ZrO_2)_{45}$ | O | O |
| 1-7 | $(Dy_2O_3)_{50}(SiO_2)_{50}$ | O | O |
| 1-8 | $(Dy_2O_3)_{50}(HfO_2)_{50}$ | O | O |
| 1-9 | $(Dy_2O_3)_{50}(Y_2O_3)_5(HfO_2)_{45}$ | O | O |
| 1-10 | $(Dy_2O_3)_{50}(ZrO_2)_{25}(SiO_2)_{25}$ | O | O |
| 1-11 | $(Dy_2O_3)_{50}(Y_2O_3)_5(ZrO_2)_{20}(SiO_2)_{25}$ | O | O |
| 1-12 | $(Dy_2O_3)_{50}(HfO_2)_{25}(SiO_2)_{25}$ | O | O |
| 1-13 | $(Dy_2O_3)_{50}(Y_2O_3)_5(HfO_2)_{20}(SiO_2)_{25}$ | O | O |
| 1-14 | $(Dy_2O_3)_{30}(ZrO_2)_{70}$ | O | O |
| 1-15 | $(Dy_2O_3)_{20}(ZrO_2)_{80}$ | Δ | O |
| 1-16 | $(Dy_2O_3)_{10}(ZrO_2)_{90}$ | X | O |
| 1-17 | $(Dy_2O_3)_{95}(In_2O_3)_5$ | O | O |
| 1-18 | $(Dy_2O_3)_{50}(In_2O_3)_{50}$ | O | O |
| 1-19 | $(Dy_2O_3)_{20}(In_2O_3)_{80}$ | Δ | O |
| 1-20 | $(Dy_2O_3)_{10}(In_2O_3)_{90}$ | X | O |
| 1-21 | $(Dy_2O_3)_{90}(ZrO_2)_5(In_2O_3)_5$ | O | O |
| 1-22 | $(Dy_2O_3)_{50}(ZrO_2)_{25}(In_2O_3)_{25}$ | O | O |
| 1-23 | $(Dy_2O_3)_{50}(Y_2O_3)_5(ZrO_2)_{20}(In_2O_3)_{25}$ | O | O |
| 1-24 | $(Dy_2O_3)_{20}(ZrO_2)_5(In_2O_3)_{75}$ | Δ | O |
| 1-25 | $(Dy_2O_3)_{20}(ZrO_2)_{75}(In_2O_3)_5$ | Δ | O |
| 1-26 | $(Dy_2O_3)_{10}(ZrO_2)_{80}(In_2O_3)_{10}$ | X | O |
| 1-27 | $(Dy_2O_3)_{10}(ZrO_2)_2(In_2O_3)_{88}$ | X | O |

TABLE 2

| Sample No. | Material for 2$^{nd}$ Dielectric Layer 106 | Recording sensitivity | Repeat overwriting capability |
|---|---|---|---|
| 1-1 | $(ZnS)_{80}(SiO_2)_{20}$ | O | X |
| 1-2 | $Dy_2O_3$ | O | O |
| 1-3 | $(Dy_2O_3)_{95}(Y_2O_3)_5$ | O | O |
| 1-4 | $(Dy_2O_3)_{95}(ZrO_2)_5$ | O | O |
| 1-5 | $(Dy_2O_3)_{50}(ZrO_2)_{50}$ | O | O |
| 1-6 | $(Dy_2O_3)_{50}(Y_2O_3)_5(ZrO_2)_{45}$ | O | O |
| 1-7 | $(Dy_2O_3)_{50}(SiO_2)_{50}$ | O | O |
| 1-8 | $(Dy_2O_3)_{50}(HfO_2)_{50}$ | O | O |
| 1-9 | $(Dy_2O_3)_{50}(Y_2O_3)5(HfO_2)_{45}$ | O | O |
| 1-10 | $(Dy_2O_3)_{50}(ZrO_2)_{25}(SiO_2)_{25}$ | O | O |
| 1-11 | $(Dy_2O_3)_{50}(Y_2O_3)_5(ZrO_2)_{20}(SiO_2)_{25}$ | O | O |
| 1-12 | $(Dy_2O_3)_{50}(HfO_2)_{25}(SiO_2)_{25}$ | O | O |
| 1-13 | $(Dy_2O_3)_{50}(Y_2O_3)_5(HfO_2)_{20}(SiO_2)_{25}$ | O | O |
| 1-14 | $(Dy_2O_3)_{30}(ZrO_2)_{70}$ | O | O |
| 1-15 | $(Dy_2O_3)_{20}(ZrO_2)_{80}$ | O | O |
| 1-16 | $(Dy_2O_3)_{10}(ZrO_2)_{90}$ | Δ | O |
| 1-17 | $(Dy_2O_3)_{95}(In_2O_3)_5$ | O | O |
| 1-18 | $(Dy_2O_3)_{50}(In_2O_3)_{50}$ | O | O |
| 1-19 | $(Dy_2O_3)_{20}(In_2O_3)_{80}$ | O | O |
| 1-20 | $(Dy_2O_3)_{10}(In_2O_3)_{90}$ | Δ | O |
| 1-21 | $(Dy_2O_3)_{90}(ZrO_2)_5(In_2O_3)_5$ | O | O |
| 1-22 | $(Dy_2O_3)_{50}(ZrO_2)_{25}(In_2O_3)_{25}$ | O | O |
| 1-23 | $(Dy_2O_3)_{50}(Y_2O_3)_5(ZrO_2)_{20}(In_2O_3)_{25}$ | O | O |
| 1-24 | $(Dy_2O_3)_{20}(ZrO_2)_5(In_2O_3)_{75}$ | O | O |
| 1-25 | $(Dy_2O_3)_{20}(ZrO_2)_{75}(In_2O_3)_5$ | O | O |
| 1-26 | $(Dy_2O_3)_{10}(ZrO_2)_{80}(In_2O_3)_{10}$ | Δ | O |
| 1-27 | $(Dy_2O_3)_{10}(ZrO_2)_2(In_2O_3)_{88}$ | Δ | O |

For these results, Sample No. 1-1 used $(ZnS)_{80}(SiO_2)_{20}$ for second dielectric layer 106, but since the sulfur contained in ZnS ends up migrating into the recording layer, the repeat overwriting capability at both 1X and 2X was seen to be poor. Moreover, in sample 1-2 that uses $Dy_2O_3$ in second dielectric layer 106, and sample 1-3 that uses $(Dy_2O_3)_{95}(Y_2O_3)_5$, both the recording sensitivity and the repeat overwriting capability at 1X and 2X were seen to be favorable. Additionally, when mixtures of $Dy_2O_3$, $Y_2O_3$, $ZrO_2$, $HfO_2$, $SiO_2$ and $In_2O_3$ were used, as in Samples 1-16, 1-20, 1-26 and 1-27 that have 10 mol % of $Dy_2O_3$, the recording sensitivity was poor at 1X and there was a mild degradation of recording sensitivity at 2X, but the repeat overwriting capability was seen to be favorable. Additionally, as in Samples 1-15, 1-19, 1-24 and 1-25 that have 20 mol % of $Dy_2O_3$, the recording sensitivity had a mild degradation at 1X, but they are useable. As in Samples 1-4 to 1-14, 1-17, 1-18 and 1-21 to 1-23 that have more than 20 mol % but no more than 95 mol % of $Dy_2O_3$, the recording sensitivity and the repeat overwriting capability were both favorable at 1X and 2X.

Here, when $Al_2O_3$, $Ga_2O_3$, MgO, ZnO, $Ta_2O_5$, $TiO_2$, $CeO_2$, $In_2O_3$, $SnO_2$, $TeO_2$, $Nb_2O_5$, $Cr_2O_3$, $Bi_2O_3$, AlN, Cr—N, Ge—N, $Si_3N_4$ or SiC was used instead of $In_2O_3$, the similar results as above were obtained. Also, when at least two compositions selected from the group of $Al_2O_3$, $Ga_2O_3$, MgO, ZnO, $Ta_2O_5$, $TiO_2$, $CeO_2$, $In_2O_3$, $SnO_2$, $TeO_2$, $Nb_2O_5$, $Cr_2O_3$, $Bi_2O_3$, AlN, Cr—N, Ge—N, $Si_3N_4$ or SiC were used instead of $In_2O_3$, the similar results as above were obtained.

Example 2

In Example 2, information recording medium 24 of FIG. 3 was constructed and was examined with respect to the material of second dielectric layer 306, the recording sensitivity and the repeat overwriting capability of second information layer 25. Specifically, samples of information recording media 24 that include second information layers 25 with different materials for second dielectric layers 306 were constructed, and the recording sensitivity and the repeat overwriting capability of second information layers 25 were measured.

The samples were manufactured as described below. First, for substrate 14, polycarbonate substrates (diameter 120 mm, thickness 1.1 mm) were prepared and a guide groove (depth 20 nm, track pitch 0.32 μm) was formed for guiding laser beam 11. Next, the following were laminated on this polycarbonate substrate by the sequential sputtering method: an Ag—Pd—Cu layer (thickness: 80 nm) as second reflective layer 208, second dielectric layer 306 (thickness: 10-20 nm), a $Ge_{28}Sn_3Bi_2Te_{34}$ layer (thickness: 10 nm) as second recording layer 304, a $(ZrO_2)_{50}(Cr_2O_3)_{50}$ layer (thickness: 5 nm) as first interface layer 303, and a $(ZnS)_{80}(SiO_2)_2O$ layer (thickness: 60 nm) as first dielectric layer 302.

Next, an ultraviolet radiation-curable resin was applied over first dielectric layer 302, and after a uniform resin layer was formed by covering and bonding substrate, on which a guide groove (depth 20 nm, track pitch 0.32 μm) was formed, on first dielectric layer 302, the resin was cured. Then, substrate was peeled. By these processes, optical separation layer 17 with thickness of 25 μm was formed, on which the guide groove leading laser beam 11 was formed at the side of first information layer 23.

After this, the following were laminated on this optical separation layer 17 by the sequential sputtering method: a $TiO_2$ layer (thickness: 20 nm) as adjustable transmittance layer 209, an Ag—Pd—Cu layer (thickness: 10 nm) as first reflective layer 208, an $(ZrO_2)_{25}(SiO_2)_{25}(Ga_2O_3)_{50}$ layer (thickness: 10 nm) as fourth interface layer 205, a $Ge_{28}Sn_3Bi_2Te_{34}$ layer (thickness: 6 nm) as fir recording layer 204, an $(ZrO_2)_{25}(SiO_2)_{25}(Cr_2O_3)_{50}$ layer (thickness: 5 nm) as third interface layer 203, and a $(ZnS)_{80}(SiO_2)_{20}$ layer (thickness: 40 nm) as third dielectric layer 202.

Finally, an ultraviolet radiation-curable resin was applied over third dielectric layer 202, and after a uniform resin layer was formed by bonding polycarbonate (diameter 120 mm, thickness 65 μm) to third dielectric layer 202 and rotating, a 75 μm thick transparent layer 13 was formed by curing the resin with ultraviolet radiation. Later, an initialization process was carried out in which second recording layer 304 and first recording layer 204 were crystallized with a laser beam. As mentioned above, a plurality of samples of different materials for second dielectric layer 306 were manufactured.

With the samples obtained in this manner, the recording sensitivity of second information layer 25 of information recording medium 24 and the repeat overwriting capability were tested using the record/reproduce device 38 in FIG. 7. In this case, the wavelength of laser beam 11 was 405 nm, numerical aperture (NA) of objective lens 34 was 0.85, the sample linear speeds during measurement were 4.9 m/sec and 9.8 m/sec, and the shortest mark length (2 T) was 0.149 μm. Additionally, the information was recorded on the groove.

Results are shown for the evaluation of materials of second dielectric layer 306 of second information layer 25 of information recording medium 24, and the recording sensitivity and the repeat overwriting capability of second information layer 25, in Table 3 for the linear speed of 4.9 m/sec (1X) and in Table 4 for the linear speed of 9.8 m/sec (2X). Here, for the recording sensitivity at 1X, <12 mW is indicated by O, ≧12 mW and <14 mW is indicated by Δ, and ≧14 mW is indicated by X. Moreover, for the recording sensitivity at 2X, <14 mW is indicated by O, ≧14 mW and <16 mW is indicated by Δ, and ≧16 mW is indicated by X. Also, for the repeat overwriting capability, a repeat overwriting cycle number of ≧1000 is indicated by O, a ≧500 but <1000 is indicated by Δ, and ≦500 is indicated by X.

TABLE 3

| Sample No. | Material for 2$^{nd}$ Dielectric Layer 106 | Recording sensitivity | Repeat overwriting capability |
|---|---|---|---|
| 2-1 | $(ZnS)_{80}(SiO_2)_{20}$ | O | X |
| 2-2 | $Dy_2O_3$ | O | O |
| 2-3 | $(Dy_2O_3)_{95}(Y_2O_3)_5$ | O | O |
| 2-4 | $(Dy_2O_3)_{95}(ZrO_2)_5$ | O | O |
| 2-5 | $(Dy_2O_3)_{50}(ZrO_2)_{50}$ | O | O |
| 2-6 | $(Dy_2O_3)_{50}(Y_2O_3)_5(ZrO_2)_{45}$ | O | O |
| 2-7 | $(Dy_2O_3)_{50}(SiO_2)_{50}$ | O | O |
| 2-8 | $(Dy_2O_3)_{50}(HfO_2)_{50}$ | O | O |
| 2-9 | $(Dy_2O_3)_{50}(Y_2O_3)_5(HfO_2)_{45}$ | O | O |
| 2-10 | $(Dy_2O_3)_{50}(ZrO_2)_{25}(SiO_2)_{25}$ | O | O |
| 2-11 | $(Dy_2O_3)_{50}(Y_2O_3)_5(ZrO_2)_{20}(SiO_2)_{25}$ | O | O |
| 2-12 | $(Dy_2O_3)_{50}(HfO_2)_{25}(SiO_2)_{25}$ | O | O |
| 2-13 | $(Dy_2O_3)_{50}(Y_2O_3)_5(HfO_2)_{20}(SiO_2)_{25}$ | O | O |
| 2-14 | $(Dy_2O_3)_{30}(ZrO_2)_{70}$ | O | O |
| 2-15 | $(Dy_2O_3)_{20}(ZrO_2)_{80}$ | Δ | O |
| 2-16 | $(Dy_2O_3)_{10}(ZrO_2)_{90}$ | X | O |
| 2-17 | $(Dy_2O_3)_{95}(In_2O_3)_5$ | O | O |
| 2-18 | $(Dy_2O_3)_{50}(In_2O_3)_{50}$ | O | O |
| 2-19 | $(Dy_2O_3)_{20}(In_2O_3)_{80}$ | Δ | O |
| 2-20 | $(Dy_2O_3)_{10}(In_2O_3)_{90}$ | X | O |
| 2-21 | $(Dy_2O_3)_{90}(ZrO_2)_5(In_2O_3)_5$ | O | O |
| 2-22 | $(Dy_2O_3)_{50}(ZrO_2)_{25}(In_2O_3)_{25}$ | O | O |
| 2-23 | $(Dy_2O_3)_{50}(Y_2O_3)_5(ZrO_2)_{20}(In_2O_3)_{25}$ | O | O |
| 2-24 | $(Dy_2O_3)_{20}(ZrO_2)_5(In_2O_3)_{75}$ | Δ | O |
| 2-25 | $(Dy_2O_3)_{20}(ZrO_2)_{75}(In_2O_3)_5$ | Δ | O |
| 2-26 | $(Dy_2O_3)_{10}(ZrO_2)_{80}(In_2O_3)_{10}$ | X | O |
| 2-27 | $(Dy_2O_3)_{10}(ZrO_2)_2(In_2O_3)_{88}$ | X | O |

TABLE 4

| Sample No. | Material for 2$^{nd}$ Dielectric Layer 106 | Recording sensitivity | Repeat overwriting capability |
|---|---|---|---|
| 2-1 | $(ZnS)_{80}(SiO_2)_{20}$ | O | X |
| 2-2 | $Dy_2O_3$ | O | O |
| 2-3 | $(Dy_2O_3)_{95}(Y_2O_3)_5$ | O | O |
| 2-4 | $(Dy_2O_3)_{95}(ZrO_2)_5$ | O | O |
| 2-5 | $(Dy_2O_3)_{50}(ZrO_2)_{50}$ | O | O |
| 2-6 | $(Dy_2O_3)_{50}(Y_2O_3)_5(ZrO_2)_{45}$ | O | O |
| 2-7 | $(Dy_2O_3)_{50}(SiO_2)_{50}$ | O | O |
| 2-8 | $(Dy_2O_3)_{50}(HfO_2)_{50}$ | O | O |
| 2-9 | $(Dy_2O_3)_{50}(Y_2O_3)_5(HfO_2)_{45}$ | O | O |
| 2-10 | $(Dy_2O_3)_{50}(ZrO_2)_{25}(SiO_2)_{25}$ | O | O |
| 2-11 | $(Dy_2O_3)_{50}(Y_2O_3)_5(ZrO_2)_{20}(SiO_2)_{25}$ | O | O |
| 2-12 | $(Dy_2O_3)_{50}(HfO_2)_{25}(Si0_2)_{25}$ | O | O |
| 2-13 | $(Dy_2O_3)_{50}(Y_2O_3)_5(HfO_2)_{20}(SiO_2)_{25}$ | O | O |
| 2-14 | $(Dy_2O_3)_{30}(ZrO_2)_{70}$ | O | O |
| 2-15 | $(Dy_2O_3)_{20}(ZrO_2)_{80}$ | O | O |
| 2-16 | $(Dy_2O_3)_{10}(ZrO_2)_{90}$ | Δ | O |
| 2-17 | $(Dy_2O_3)_{95}(In_2O_3)_5$ | O | O |
| 2-18 | $(Dy_2O_3)_{50}(In_2O_3)_{50}$ | O | O |
| 2-19 | $(Dy_2O_3)_{20}(In_2O_3)_{80}$ | O | O |
| 2-20 | $(Dy_2O_3)_{10}(In_2O_3)_{90}$ | Δ | O |
| 2-21 | $(Dy_2O_3)_{90}(ZrO_2)_5(In_2O_3)_5$ | O | O |
| 2-22 | $(Dy_2O_3)_{50}(ZrO_2)_{25}(In_2O_3)_{25}$ | O | O |
| 2-23 | $(Dy_2O_3)_{50}(Y_2O_3)_5(ZrO_2)_{20}(In_2O_3)_{25}$ | O | O |
| 2-24 | $(Dy_2O_3)_{20}(ZrO_2)_5(In_2O_3)_{75}$ | O | O |
| 2-25 | $(Dy_2O_3)_{20}(ZrO_2)_{75}(In_2O_3)_5$ | O | O |
| 2-26 | $(Dy_2O_3)_{10}(ZrO_2)_{80}(In_2O_3)_{10}$ | Δ | O |
| 2-27 | $(Dy_2O_3)_{10}(ZrO_2)_2(In_2O_3)_{88}$ | Δ | O |

For these results, Sample No. 2-1 used $(ZnS)_{80}(SiO_2)_{20}$ for second dielectric layer 306, but since the sulfur contained in ZnS ends up migrating into the recording layer, the repeat overwriting capability at both 1X and 2X was seen to be poor. Moreover, in sample 2-2 that uses $Dy_2O_3$ in second dielectric layer 306, and sample 2-3 that uses $(Dy_2O_3)_{95}(Y_2O_3)_5$, both the recording sensitivity and the repeat overwriting capability at 1X and 2X were seen to be favorable. Additionally, when mixtures of $Dy_2O_3$, $Y_2O_3$, $ZrO_2$, $HfO_2$, $SiO_2$ and $In_2O_3$ were used, as in Samples 2-16, 2-20, 2-26 and 2-27 that have 10 mol % of $Dy_2O_3$, the recording sensitivity was poor at 1X and there was a mild degradation of recording sensitivity at 2X, but the repeat overwriting capability was seen to be favorable. Additionally, as in Samples 2-15, 2-19, 2-24 and 2-25 that have 20 mol % of $Dy_2O_3$, the recording sensitivity had a mild degradation at 1X, but they are useable. As in Samples 2-4 to 2-14, 2-17, 2-18 and 2-21 to 2-23 that have more than 20 mol % but no more than 95 mol % of $Dy_2O_3$, the recording sensitivity and the repeat overwriting capability were both faborable at 1X and 2X.

Here, when $Al_2O_3$, $Ga_2O_3$, MgO, ZnO, $Ta_2O_5$, $TiO_2$, $CeO_2$, $In_2O_3$, $SnO_2$, $TeO_2$, $Nb_2O_5$, $Cr_2O_3$, $Bi_2O_3$, AlN, Cr—N, Ge—N, $Si_3N_4$ or SiC was used instead of $In_2O_3$, the similar results as above were obtained. Also, when at least two compositions selected from the group of $Al_2O_3$, $Ga_2O_3$, MgO, ZnO, $Ta_2O_5$, $TiO_2$, $CeO_2$, $In_2O_3$, $SnO_2$, $TeO_2$, $Nb_2O_5$, $Cr_2O_3$, $Bi_2O_3$, AlN, Cr—N, Ge—N, $Si_3N_4$ or SiC were used instead of $In_2O_3$, the similar results as above were obtained.

Example 3

In Example 1, when second interface layer 105 was added to the structure, the repeat overwriting capability of information layer 106 of information recording medium 15 was improved. Similarly, in Example 2, when second interface layer 305 was added to the structre, the repeat overwriting capability of second information layer 25 of information recording medium 24 was improved. Additionally, as materials of second interface layer 105 and second interface layer 305, it was found that O and at least one element selected from Zr, Hf, Y and Si, and at least one element selected from Ga, In and Cr were preferable. In this case, it was also found that at least one oxide selected from $ZrO_2$, $HfO_2$, $Y_2O_3$ and $SiO_2$ and at least one oxide selected from $Ga_2O_3$, $In_2O_3$ and $Cr_2O_3$ is preferable.

Example 4

In Example 2, information recording medium 24 of FIG. 3 was constructed and was examined with respect to the material of fourth dielectric layer 206, the recording sensitivity and the repeat overwriting capability of first information layer 23. Specifically, samples of information recording media 24 that include first information layers 23 with different materials for fourth dielectric layers 206 were constructed, and the recording sensitivity and the repeat overwriting capability of first information layers 23 were measured.

The samples were manufactured as described below. First, for substrate 14, polycarbonate substrates (diameter 120 mm, thickness 1.1 mm) were prepared and a guide groove (depth 20 nm, track pitch 0.32 μm) was formed for guiding laser beam 11. Next, the following were laminated on this polycarbonate substrate by the sequential sputtering method: an Ag—Pd—Cu layer (thickness: 80 nm) as second reflective layer 208, a $Dy_2O_3$ layer (thickness: 15 nm) as second dielectric layer 306, a $(ZrO_2)_{50}(In_2O_3)_{50}$ layer (thickness: 5 nm) as second interface layer 305, a $Ge_{28}Sn_3Bi_2Te_{34}$ layer (thickness: 10 nm) as second recording layer 304, a $(ZrO_2)_{50}(Cr_2O_3)_{50}$ layer (thickness: 5 nm) as first interface layer 303, and a $(ZnS)_{80}(SiO_2)_{20}$ layer (thickness: 60 nm) as first dielectric layer 302.

Next, an ultraviolet radiation-curable resin was applied over first dielectric layer 302, and after a uniform resin layer was formed by covering and bonding substrate, on which a guide groove (depth 20 nm, track pitch 0.32 μm) was formed, on first dielectric layer 302, the resin was cured. Then, substrate was peeled. By these processes, optical separation layer 17 with thickness of 25 μm was formed, on which the guide groove leading laser beam 11 was formed at the side of first information layer 23.

After this, the following were laminated on this optical separation layer 17 by the sequential sputtering method: a $TiO_2$ layer (thickness: 20 nm) as adjustable transmittance layer 209, an Ag—Pd—Cu layer (thickness: 10 nm) as first reflective layer 208, fourth dielectric layer 206 (thickness: 5 nm), an $(ZrO_2)_{25}(SiO_2)_{25}(In_2O_3)_{50}$ layer (thickness: 5 nm) as fourth interface layer 205, a $Ge_{28}Sn_3Bi_2Te_{34}$ layer (thickness: 6 nm) as first recording layer 204, an $(ZrO_2)_{25}(SiO_2)_{25}(Cr_2O_3)_{50}$ layer (thickness: 5 nm) as third interface layer 203, and a $(ZnS)_{80}(SiO_2)_{20}$ layer (thickness: 40 nm) as third dielectric layer 202.

Finally, an ultraviolet radiation-curable resin was applied over third dielectric layer 202, and after a uniform resin layer was formed by bonding polycarbonate (diameter 120 mm, thickness 65 μm) to third dielectric layer 202 and rotating, a 75 μm thick transparent layer 13 was formed by curing the resin with ultraviolet radiation. Later, an initialization process was carried out in which second recording layer 304 and first recording layer 204 were crystallized with a laser beam. As mentioned above, a plurality of samples of different materials for second dielectric layer 306 were manufactured.

With the samples obtained in this manner, the recording sensitivity of second information layer 25 of information recording medium 24 and the repeat overwriting capability were tested using the record/reproduce device 38 in FIG. 7. In this case, the wavelength of laser beam 11 was 405 nm, numerical aperture (NA) of objective lens 34 was 0.85, the sample linear speeds during measurement were 4.9 m/sec and 9.8 m/sec, and the shortest mark length (2 T) was 0.149 μm. Additionally, the information was recorded on the groove.

Results are shown for the evaluation of materials of fourth dielectric layer 206 of first information layer 23 of information recording medium 24, and the recording sensitivity and the repeat overwriting capability of first information layer 23, in Table 5 for the linear speed of 4.9 m/sec (1X) and in Table 6 for the linear speed of 9.8 m/sec (2X). Here, for the recording sensitivity at 1X, <12 mW is indicated by O, $\geq$12 mW and <14 mW is indicated by Δ, and $\geq$14 mW is indicated by X. Moreover, for the recording sensitivity at 2X, <14 mW is indicated by O, $\geq$14 mW and <16 mW is indicated by Δ, and $\geq$16 mW is indicated by X. Also, for the repeat overwriting capability, a repeat overwriting cycle number of $\geq$1000 is indicated by O, a $\geq$500 but <1000 is indicated by Δ, and $\leq$500 is indicated by X.

TABLE 5

| Sample No. | Material for 2$^{nd}$ Dielectric Layer 106 | Recording sensitivity | Repeat overwriting capability |
|---|---|---|---|
| 3-1 | $(ZnS)_{80}(SiO_2)_{20}$ | O | X |
| 3-2 | $Dy_2O_3$ | O | Δ |
| 3-3 | $(Dy_2O_3)_{95}(Y_2O_3)5$ | O | Δ |
| 3-4 | $(Dy_2O_3)_{95}(ZrO_2)5$ | O | Δ |
| 3-5 | $(Dy_2O_3)_{50}(ZrO_2)_{50}$ | O | O |
| 3-6 | $(Dy_2O_3)_{50}(Y_2O_3)5(ZrO_2)_{45}$ | O | O |
| 3-7 | $(Dy_2O_3)_{50}(SiO_2)_{50}$ | O | O |
| 3-8 | $(Dy_2O_3)_{50}(HfO_2)_{50}$ | O | O |
| 3-9 | $(Dy_2O_3)_{50}(Y_2O_3)5(HfO_2)_{45}$ | O | O |
| 3-10 | $(Dy_2O_3)_{50}(ZrO_2)_{25}(SiO_2)_{25}$ | O | O |
| 3-11 | $(Dy_2O_3)_{50}(Y_2O_3)5(ZrO_2)_{20}(SiO_2)_{25}$ | O | O |
| 3-12 | $(Dy_2O_3)_{50}(HfO_2)_{25}(SiO_2)_{25}$ | O | O |
| 3-13 | $(Dy_2O_3)_{50}(Y_2O_3)5(HfO_2)_{20}(SiO_2)_{25}$ | O | O |
| 3-14 | $(Dy_2O_3)_{30}(ZrO_2)_{70}$ | O | O |
| 3-15 | $(Dy_2O_3)_{20}(ZrO_2)_{80}$ | Δ | O |

TABLE 5-continued

| Sample No. | Material for 2nd Dielectric Layer 106 | Recording sensitivity | Repeat overwriting capability |
|---|---|---|---|
| 3-16 | $(Dy_2O_3)_{10}(ZrO_2)_{90}$ | X | ○ |
| 3-17 | $(Dy_2O_3)_{95}(In_2O_3)_5$ | ○ | Δ |
| 3-18 | $(Dy_2O_3)_{50}(In_2O_3)_{50}$ | ○ | ○ |
| 3-19 | $(Dy_2O_3)_{20}(In_2O_3)_{80}$ | Δ | ○ |
| 3-20 | $(Dy_2O_3)_{10}(In_2O_3)_{90}$ | X | ○ |
| 3-21 | $(Dy_2O_3)_{90}(ZrO_2)_5(In_2O_3)_5$ | ○ | ○ |
| 3-22 | $(Dy_2O_3)_{50}(ZrO_2)_{25}(In_2O_3)_{25}$ | ○ | ○ |
| 3-23 | $(Dy_2O_3)_{50}(Y_2O_3)_5(ZrO_2)_{20}(In_2O_3)_{25}$ | ○ | ○ |
| 3-24 | $(Dy_2O_3)_{20}(ZrO_2)_5(In_2O_3)_{75}$ | Δ | ○ |
| 3-25 | $(Dy_2O_3)_{20}(ZrO_2)_{75}(In_2O_3)_5$ | Δ | ○ |
| 3-26 | $(Dy_2O_3)_{10}(ZrO_2)_{80}(In_2O_3)_{10}$ | X | ○ |
| 3-27 | $(Dy_2O_3)_{10}(ZrO_2)_2(In_2O_3)_{88}$ | X | ○ |

TABLE 6

| Sample No. | Material for 2nd Dielectric Layer 106 | Recording sensitivity | Repeat overwriting capability |
|---|---|---|---|
| 3-1 | $(ZnS)_{80}(SiO_2)_{20}$ | ○ | X |
| 3-2 | $Dy_2O_3$ | ○ | ○ |
| 3-3 | $(Dy_2O_3)_{95}(Y_2O_3)_5$ | ○ | ○ |
| 3-4 | $(Dy_2O_3)_{95}(ZrO_2)_5$ | ○ | ○ |
| 3-5 | $(Dy_2O_3)_{50}(ZrO_2)_{50}$ | ○ | ○ |
| 3-6 | $(Dy_2O_3)_{50}(Y_2O_3)_5(ZrO_2)_{45}$ | ○ | ○ |
| 3-7 | $(Dy_2O_3)_{50}(SiO_2)_{50}$ | ○ | ○ |
| 3-8 | $(Dy_2O_3)_{50}(HfO_2)_{50}$ | ○ | ○ |
| 3-9 | $(Dy_2O_3)_{50}(Y_2O_3)_5(HfO_2)_{45}$ | ○ | ○ |
| 3-10 | $(Dy_2O_3)_{50}(ZrO_2)_{25}(SiO_2)_{25}$ | ○ | ○ |
| 3-11 | $(Dy_2O_3)_{50}(Y_2O_3)_5(ZrO_2)_{20}(SiO_2)_{25}$ | ○ | ○ |
| 3-12 | $(Dy_2O_3)_{50}(HfO_2)_{25}(SiO_2)_{25}$ | ○ | ○ |
| 3-13 | $(Dy_2O_3)_{50}(Y_2O_3)_5(HfO_2)_{20}(SiO_2)_{25}$ | ○ | ○ |
| 3-14 | $(Dy_2O_3)_{30}(ZrO_2)_{70}$ | ○ | ○ |
| 3-15 | $(Dy_2O_3)_{20}(ZrO_2)_{80}$ | Δ | ○ |
| 3-16 | $(Dy_2O_3)_{10}(ZrO_2)_{90}$ | ○ | ○ |
| 3-17 | $(Dy_2O_3)_{95}(In_2O_3)_5$ | ○ | Δ |
| 3-18 | $(Dy_2O_3)_{50}(In_2O_3)_{50}$ | ○ | ○ |
| 3-19 | $(Dy_2O_3)_{20}(In_2O_3)_{80}$ | ○ | ○ |
| 3-20 | $(Dy_2O_3)_{10}(In_2O_3)_{90}$ | Δ | ○ |
| 3-21 | $(Dy_2O_3)_{90}(ZrO_2)_5(In_2O_3)_5$ | ○ | ○ |
| 3-22 | $(Dy_2O_3)_{50}(ZrO_2)_{25}(In_2O_3)_{25}$ | ○ | ○ |
| 3-23 | $(Dy_2O_3)_{50}(Y_2O_3)_5(ZrO_2)_{20}(In_2O_3)_{25}$ | ○ | ○ |
| 3-24 | $(Dy_2O_3)_{20}(ZrO_2)_5(In_2O_3)_{75}$ | ○ | ○ |
| 3-25 | $(Dy_2O_3)_{20}(ZrO_2)_{75}(In_2O_3)_5$ | ○ | ○ |
| 3-26 | $(Dy_2O_3)_{10}(ZrO_2)_{80}(In_2O_3)_{10}$ | Δ | ○ |
| 3-27 | $(Dy_2O_3)_{10}(ZrO_2)_2(In_2O_3)_{88}$ | Δ | ○ |

For these results, Sample No. 3-1 used $(ZnS)_{80}(SiO_2)_{20}$ for fourth dielectric layer 206, but since the sulfur contained in ZnS ends up migrating into the recording layer, the repeat overwriting capability at both 1X and 2X was seen to be poor. Moreover, in sample 3-2 that uses $Dy_2O_3$ in fourth dielectric layer 206, sample 3-3 that uses $(Dy_2O_3)_{95}(Y_2O_3)_5$, sample 3-4 that uses $(Dy_2O_3)_{95}(ZrO_2)_5$, and sample 3-17 that uses $(Dy_2O_3)_{95}(In_2O_3)_5$, there was a mild degeneration of recording sensitivity at 1X, but they were useable. Additionally, when mixtures of $Dy_2O_3$, $Y_2O_3$, $ZrO_2$, $HfO_2$, $SiO_2$ and $In_2O_3$ were used for fourth dielectric layer 206, as in Samples 3-16, 3-20, 3-26 and 3-27 that have 10 mol % of $Dy_2O_3$, the recording sensitivity was poor at 1X and there was a mild degradation of recording sensitivity at 2X, but the repeat overwriting capability was seen to be favorable. Additionally, as in Samples 3-15, 3-19, 3-24 and 3-25 that have 20 mol % of $Dy_2O_3$, the recording sensitivity had a mild degradation at 1X, but they are useable.

As in Samples 3-5 to 3-13, 3-18, and 3-21 to 3-23 that have more than 20 mol % but no more than 95 mol % of $Dy_2O_3$, the recording sensitivity and the repeat overwriting capability were both favorable at 1X and 2X.

Here, when $Al_2O_3$, $Ga_2O_3$, MgO, ZnO, $Ta_2O_5$, $TiO_2$, $CeO_2$, $In_2O_3$, $SnO_2$, $TeO_2$, $Nb_2O_5$, $Cr_2O_3$, $Bi_2O_3$, AlN, Cr—N, Ge—N, $Si_3N_4$ or SiC was used instead of $In_2O_3$, the similar results as above were obtained. Also, when at least two compositions selected from the group of $Al_2O_3$, $Ga_2O_3$, MgO, ZnO, $Ta_2O_5$, $TiO_2$, $CeO_2$, $In_2O_3$, $SnO_2$, $TeO_2$, $Nb_2O_5$, $Cr_2O_3$, $Bi_2O_3$, AlN, Cr—N, Ge—N, Ge—N, $Si_3N_4$ or SiC were used instead of $In_2O_3$, the similar results as above were obtained.

Example 5

In Example 5, information recording medium 29 of FIG. 4 was constructed and the same experiment as Example 1 was carried out.

The samples were manufactured as described below. First, as substrate 26, polycarbonate substrates (diameter 120 mm, thickness 0.6 mm) were prepared and a guide groove (depth 40 nm, track pitch 0.344 μm) was formed for guiding laser beam 11. Next, the following were laminated on this polycarbonate substrate by the sequential sputtering method: a $(ZnS)_{80}(SiO_2)_{20}$ layer (thickness: 60 nm) as first dielectric layer 102, a $(ZrO_2)_{50}(Cr_2O_3)_{50}$ layer (thickness: 5 nm) as first interface layer 103, a $Ge_{28}Sn_3Bi_2Te_{34}$ layer (thickness: 10 nm) as recording layer 104, second dielectric layer 106 (thickness: 10-20 nm), and an Ag—Pd—Cu layer (thickness: 80 nm) as reflective layer 108.

Then, an ultraviolet radiation-curable resin was applied over dummy substrate 28, and after a uniform resin layer (thickness: 20 μm) was formed by bonding reflective layer 108 of substrate 26 to dummy substrate 28 and rotating, substrate 26 and dummy substrate 28 were adhered with adhesive layer therebetween. Finally, an initialization process was carried out in which all surface of recording layer 104 was crystallized with a laser beam.

With the samples obtained in this manner, the recording sensitivity of information layer 16 of information recording medium 29 and the repeat overwriting capability were tested by the same method as Example 1. In this case, the wavelength of laser beam 11 was 405 nm, numerical aperture (NA) of objective lens 34 was 0.65, the sample linear speeds during measurement were 8.6 m/sec and 17.2 m/sec, and the shortest mark length (2 T) was 0.294 μm. Additionally, the information was recorded on the groove.

For these results, same as Example 1, when $(ZnS)_{80}(SiO_2)_{20}$ was used for second dielectric layer 106, but since the sulfur contained in ZnS ends up migrating into the recording layer, the repeat overwriting capability at both 1X and 2X was seen to be poor. Moreover, $Dy_2O_3$ or $(Dy_2O_3)_{95}(Y_2O_3)_5$ was used in second dielectric layer 106, both the recording sensitivity and the repeat overwriting capability at 1X and 2X were seen to be favorable. Additionally, when mixtures of $Dy_2O_3$, $Y_2O_3$, $ZrO_2$, $HfO_2$, $SiO_2$ and $In_2O_3$, which have more than 20 mol % but no more than 95 mol % of $Dy_2O_3$, were used for second dielectric layer 106, the recording sensitivity and the repeat overwriting capability were seen to be favorable at 1X and 2X.

Here, when $Al_2O_3$, $Ga_2O_3$, MgO, ZnO, $Ta_2O_5$, $TiO_2$, $CeO_2$, $In_2O_3$, $SnO_2$, $TeO_2$, $Nb_2O_5$, $Cr_2O_3$, $Bi_2O_3$, AlN, Cr—N, Ge—N, $Si_3N_4$ or SiC was used instead of $In_2O_3$, the similar results as above were obtained. Also, when at least two compositions selected from the group of $Al_2O_3$, $Ga_2O_3$, MgO, ZnO, $Ta_2O_5$, $TiO_2$, $CeO_2$, $In_2O_3$, $SnO_2$, $TeO_2$, $Nb_2O_5$, $Cr_2O_3$, $Bi_2O_3$, AlN, Cr—N, Ge—N, $Si_3N_4$ or SiC were used instead of $In_2O_3$, the similar results as above were obtained.

Example 6

In Example 6, information recording medium 32 of FIG. 6 was constructed and the same experiment as Example 2 was carried out.

The samples were manufactured as described below. First, as substrate 26, polycarbonate substrates (diameter 120 mm, thickness 0.6 mm) were prepared and a guide groove (depth 40 nm, track pitch 0.344 µm) was formed for guiding laser beam 11. Next, the following were laminated on this polycarbonate substrate by the sequential sputtering method: a $(ZnS)_{80}(SiO_2)_{20}$ layer (thickness: 40 nm) as third dielectric layer 202, an $(ZrO_2)_{25}(SiO_2)_{25}(Cr_2O_3)_{50}$ layer (thickness 5 nm) as third interface layer 203, a $Ge_{28}Sn_3Bi_2Te_{34}$ layer (thickness: 6 nm) as first recording layer 204, an $(ZrO_2)_{25}(SiO_2)_{25}(Ga_2O_3)_{50}$ layer (thickness: 10 nm) as fourth interface layer 205, an Ag—Pd—Cu layer (thickness: 10 nm) as first reflective layer 208, and a $TiO_2$ layer (thickness: 20 nm) as adjustable transmittance layer 209.

As substrate 30, polycarbonate substrates (diameter 120 mm, thickness 0.58 mm) were prepared and a guide groove (depth 40 nm, track pitch 0.344 µm) was formed for guiding laser beam 11. Next, the following were laminated on this polycarbonate substrate by the sequential sputtering method: an Ag—Pd—Cu layer (thickness: 80 nm) as second reflective layer 208, second dielectric layer 306 (thickness: 10-20 nm), a $Ge_{28}Sn_3Bi_2Te_{34}$ layer (thickness: 10 nm) as second recording layer 304, a $(ZrO_2)_{50}(Cr_2O_3)_{50}$ layer (thickness: 5 nm) as first interface layer 303, and a $(ZnS)_{80}(SiO_2)_{20}$ layer (thickness: 60 nm) as first dielectric layer 302.

Next, an ultraviolet radiation-curable resin was applied over first dielectric layer 302 of substrate 30, and after a uniform resin layer (thickness: 20 nm) was formed by bonding adjustable transmittance layer 209 of substrate 26 to a substrate 30 and rotating, substrate 26 and substrate 30 are adhered with adhesive layer 27 therebetween. Finally, an initialization process was carried out in which all surface of second recording layer 304 and first recording layer 204 were crystallized with a laser beam.

With the samples obtained in this manner, the recording sensitivity of second information layer 25 of information recording medium 32 and the repeat overwriting capability were tested by the same method as Example 2. In this case, the wavelength of laser beam 11 was 405 nm, numerical aperture (NA) of objective lens 34 was 0.65, the sample linear speeds during measurement were 8.6 m/sec and 17.2 m/sec, and the shortest mark length (2 T) was 0.294 µm. Additionally, the information was recorded on the groove.

For these results, same as Example 2, when $(ZnS)_{80}(SiO_2)_{20}$ was used for second dielectric layer 306, but since the sulfur contained in ZnS ends up migrating into the recording layer, the repeat overwriting capability at both 1X and 2X was seen to be poor. Moreover, $Dy_2O_3$ or $(Dy_2O_3)_{95}(Y_2O_3)_5$ was used in second dielectric layer 306, both the recording sensitivity and th repeat overwriting capability at 1X and 2X were seen to be favorable. Additionally, when mixtures of $Dy_2O_3$, $Y_2O_3$, $ZrO_2$, $HfO_2$, $SiO_2$ and $In_2O_3$, which have more than 20 mol % but no more than 95 mol % of $Dy_2O_3$, were used for second dielectric layer 306, the recording sensitivity and the repeat overwriting capability were seen to be favorable at 1X and 2X.

Here, when $Al_2O_3$, $Ga_2O_3$, MgO, ZnO, $Ta_2O_5$, $TiO_2$, $CeO_2$, $In_2O_3$, $SnO_2$, $TeO_2$, $Nb_2O_5$, $Cr_{23}$, $Bi_2O_3$, AlN, Cr—N, Ge—N, $Si_3N_4$ or SiC was used instead of $In_2O_3$, the similar results as above were obtained. Also, when at least two compositions selected from the group of $Al_2O_3$, $Ga_2O_3$, MgO, ZnO, $Ta_2O_5$, $TiO_2$, $CeO_2$, $In_2O_3$, $SnO_2$, $TeO_2$, $Nb_2O_5$, $Cr_2O_3$, $Bi_2O_3$, AlN, Cr—N, Ge—N, $Si_3N_4$ or SiC were used instead of $In_2O_3$, the similar results as above were obtained.

Example 7

In Example 5, when second interface layer 105 was added to the structre, the repeat overwriting capability of information layer 16 of information recording medium 29 was improved. Similarly, in Example 6, when second interface layer 305 was added to the structre, the repeat overwriting capability of second information layer 25 of information recording medium 32 was improved. Additionally, as materials of second interface layer 105 and second interface layer 305, it was found that O and at least one element selected from Zr, Hf, Y and Si, and at least one element selected from Ga, In and Cr were preferable. In this case, it was also found that at least one oxide selected from $ZrO_2$, $HfO_2$, $Y_2O_3$ and $SiO_2$ and at least one oxide selected from $Ga_2O_3$, $In_2O_3$ and $Cr_2O_3$ were preferable.

Example 8

In Example 8, information recording medium 32 of FIG. 6 was constructed and the same experiment as Example 4 was carried out.

The samples were manufactured as described below. First, as substrate 26, polycarbonate substrates (diameter 120 mm, thickness 0.6 mm) were prepared and a guide groove (depth 40 nm, track pitch 0.344 µm) was formed for guiding laser beam 11. Next, the following were laminated on this polycarbonate substrate by the sequential sputtering method: a $(ZnS)_{80}(SiO_2)_{20}$ layer (thickness: 40 nm) as third dielectric layer 202, an $(ZrO_2)_{25}(SiO_2)_{25}(Cr_2O_3)_{50}$ layer (thickness interface layer 203, a $Ge_{28}Sn_3Bi_2Te_{34}$ layer (thickness: 6 nm) as first recording layer 204, an $(ZrO_2)_{25}(SiO_2)_{25}(In_2O_3)_{50}$ layer (thickness: 5 nm) as fourth interface layer 205, fourth dielectric layer 206 (thickness: 5 nm), an Ag—Pd—Cu layer (thickness: 10 nm) as first reflective layer 208, and a $TiO_2$ layer (thickness: 20 nm) as adjustable transmittance layer 209.

As substrate 30, polycarbonate substrates (diameter 120 mm, thickness 0.58 mm) were prepared and a guide groove (depth 40 nm, track pitch 0.344 µm) was formed for guiding laser beam 11. Next, the following were laminated on this polycarbonate substrate by the sequential sputtering method: an Ag—Pd—Cu layer (thickness: 80 nm) as second reflective layer 208, a $Dy_2O_3$ layer (thickness: 15 nm) as second dielectric layer 306, a $(ZrO_2)_{50}(In_2O_3)_{50}$ layer (thickness: 5 nm) as second interface layer 305, a $Ge_{28}Sn_3Bi_2Te_{34}$ layer (thickness: 10 nm) as second recording layer 304, a $(ZrO_2)_{50}(Cr_2O_3)_{50}$ layer (thickness: 5 nm) as first interface layer 303, and a $(ZnS)_{80}(SiO_2)_{20}$ layer (thickness: 60 nm) as first dielectric layer 302.

Next, an ultraviolet radiation-curable resin was applied over first dielectric layer 302 of substrate 30, and after a uniform resin layer (thickness: 20 nm) was formed by bonding adjustable transmittance layer 209 of substrate 26 to a substrate 30 and rotating, substrate 26 and substrate 30 are adhered with adhesive layer 27 therebetween. Finally, an initialization process was carried out in which all surface of second recording layer 304 and first recording layer 204 were crystallized with a laser beam.

With the samples obtained in this manner, the recording sensitivity of first information layer 23 of information recording medium 32 and the repeat overwriting capability were tested by the same method as Example 4. In this case, the wavelength of laser beam 11 was 405 nm, numerical aperture (NA) of objective lens 34 was 0.65, the sample linear speeds during measurement were 8.6 m/sec and 17.2 n/sec, and the shortest mark length (2 T) was 0.294 μm. Additionally, the information was recorded on the groove.

For these results, same as Example 4, when $(ZnS)_{80}(SiO_2)_{20}$ was used for fourth dielectric layer 206, but since the sulfur contained in ZnS ends up migrating into the recording layer, the repeat overwriting capability at both 1X and 2X was seen to be poor. Moreover, $Dy_2O_3$ or $(Dy_2O_3)_{95}(Y_2O_3)_5$ was used in fourth dielectric layer 206, both the recording sensitivity and the repeat overwriting capability at 1X and 2X were seen to be favorable. Additionally, when mixtures of $Dy_2O_3$, $Y_2O_3$, $ZrO_2$, $HfO_2$, $SiO_2$ and $In_2O_3$, which have more than 20 mol % but no more than 95 mol % of $Dy_2O_3$, were used for fourth dielectric layer 206, the recording sensitivity and the repeat overwriting capability were seen to be favorable at 1X and 2X.

Here, when $Al_2O_3$, $Ga_2O_3$, MgO, ZnO, $Ta_2O_5$, $TiO_2$, $CeO_2$, $In_2O_3$, $SnO_2$, $TeO_2$, $Nb_2O_5$, $Cr_2O_3$, $Bi_2O_3$, AlN, Cr—N, Ge—N, $Si_3N_4$ or SiC was used instead of $In_2O_3$, the similar results as above were obtained. Also, when at least two compositions selected from the group of $Al_2O_3$, $Ga_2O_3$, MgO, ZnO, $Ta_2O_5$, $TiO_2$, $CeO_2$, $In_2O_3$, $SnO_2$, $TeO_2$, $Nb_2O_5$, $Cr_2O_3$, $Bi_2O_3$, $Bi_2O_3$, AlN, Cr—N, Ge—N, $Si_3N_4$ or SiC were used instead of $In_2O_3$, the similar results as above were obtained.

Example 9

In Example 1 to 8, materials described by (Ge—Sn)Te, $GeTe$—$Sb_2Te_3$, (Ge—Sn)Te—$Sb_2Te_3$, $GeTe$—$Bi_2Te_3$, (Ge—Sn)Te—$Bi_2Te_3$, $GeTe$—(Sb—Bi)$_2Te_3$, (Ge—Sn)Te—(Sb—Bi)$_2Te_3$, $GeTe$—(Bi—In)$_2Te_3$, or (Ge—Sn)Te—(Bi—In)$_2Te_3$, was used instead of $Dy_2O_3$ of recording layer 104, first recording layer 204, and second recording layer 304, the same results were obtained.

Example 10

In Example 1 to 9, when $Sc_2O_3$, $Y_2O_3$, $La_2O_3$, $Gd_2O_3$, or $Yb_2O_3$ was used instead of $Dy_2O_3$ of second dielectric layer 106, fourth dielectric layer 206, and second dielectric layer 306, the same results were obtained. Additionally, when a composition including at least two oxides selected from a group of $Sc_2O_3$, $Y_2O_3$, $La_2O_3$, $Gd_2O_3$, or $Yb_2O_3$ was used instead of $Dy_2O_3$ of second dielectric layer 106, fourth dielectric layer 206, and second dielectric layer 306, the same results were obtained.

Example 11

In Example 10, electrical information recording medium 44 of FIG. 8 was manufactured, and the phase-change due to application of an electrical current was observed.

A silicon substrate with a nitride-treated surface was prepared as substrate 39, on which was laminated by the sequential sputtering method: Pt (surface area: 6 μm×6 μm; thickness: 0.1 μm), used for lower electrode 40; $Dy_2O_3$ (surface area: 4.5 μm×5 μm; thickness: 0.01 μm), used for first dielectric layer 401; $Ge_{22}Bi_2Te_{25}$ (surface area: 5 μm×5 μm; thickness: 0.1 μm), used for first recording layer 41; $Sb_{70}Te_{25}Ge_5$ (surface area: 5 μm×5 μm; thickness: 0.1 μm), used for second recording layer 42; $Dy_2O_3$ (surface area: 4.5 μm×5 μm; thickness: 0.01 μm), used for second dielectric layer 402; and, Pt (surface area: 5 μm×5 μm; thickness: 0.1 μm), used for upper electrode 43. First dielectric layer 401 and second dielectric layer 402 were insulators. Consequently, in order for electric current to flow in first recording layer 41 and second recording layer 42, the films of first dielectric layer 401 and second dielectric layer 402 had to be formed with a smaller surface area than that of first recording layer 41 and second recording layer 42, and lower electrode 40, first recording layer 41, second recording layer 42 and upper electrode 43 were equipped with a connector unit.

Then, lower electrode 40 and upper electrode 43 were bonded to Au lead lines, and electrical information recording medium 44 was connected to electrical information record/reproduce device 50 through application unit 45. From this electrical information record/reproduce device 50, pulse electrical source 48 was connected between lower electrode 40 and upper electrode 43 by means of switch 47, and furthermore the changes in resistance value due to the phase-changes in first recording layer 41 and second recording layer 42 could be detected by means of resistance meter 46 connected via switch 49 between lower electrode 40 and upper electrode 43.

Here, the melting point $T_{m1}$ of first recording layer was 630° C., the crystallization temperature $T_{x1}$ was 170° C. and the crystallization time $t_{x1}$ was 100 ns. In addition, the melting point $T_{m2}$ of second recording layer was 550° C., the crystallization temperature $T_{x2}$ was 200° C. and the crystallization time $t_{x2}$ was 50 ns. Moreover, the resistance $r_{a1}$ of the amorphous phase from first recording layer 41 was 500 Ω, the resistance $r_{c1}$ for the crystalline phase was 10 Ω, resistance $r_{c2}$ of the amorphous phase from second recording layer 42 was 500 Q, and the resistance $r_{c2}$ for the crystalline phase was 20 Ω.

If first recording layer 41 and second recording layer 42 are both in the amorphous phase (status 1), and electrical current pulse of $I_{c1}$=5 mA, $t_{c1}$=150 ns in the waveform shown in FIG. 11 was applied between lower electrode 40 and upper electrode 43, only first recording layer 41 would undergo the transition from amorphous to crystalline (referred to below as Status 2). Additionally, in Status 1, when an electrical current pulse of $I_{c2}$=10 mA and $t_{c2}$=100 ns in recording waveform 502 shown in FIG. 11 was applied between lower electrode 40 and upper electrode 43, only second recording layer 42 would undergo the transition from amorphous to crystalline (referred to below as Status 3). Additionally, in Status 1, when an electrical current pulse of $I_{c2}$=10 mA and $t_{c1}$=150 ns in recording waveform 502 shown in FIG. 11 was applied between lower electrode 40 and upper electrode 43, only second recording layer 42 would undergo the transition from amorphous to crystalline (referred to below as Status 3).

Next, in the low resistance state (Status 4) where both first recording layer 41 and second recording layer 42 were in the crystalline phase, when an electrical current pulse of $I_{a1}$=20 mA, $I_{c2}$=10 mA and $t_{c2}$=100 ns was applied between lower electrode 40 and upper electrode 43, only first recording layer 41 would undergo the transition from crystalline to amorphous (Status 3). Moreover, in Status 4, when an electrical current pulse of $I_{a2}$=15 mA and $t_{a2}$=50 ns in recording waveform 505 shown in FIG. 11 was applied between lower electrode 40 and upper electrode 43, only second recording layer 42 would undergo the transition from crystalline to amorphous (Status 2). Additionally, in Status 4, when an electrical current pulse of $I_{a1}$=20 mA, $t_{a1}$=50 ns in erasing waveform 506 shown in FIG. 11 was applied between lower electrode 40 and upper electrode 43, both first recording layer 41 and second recording layer 42 would undergo the transition from crystalline to amorphous (Status 1).

Figure 11:
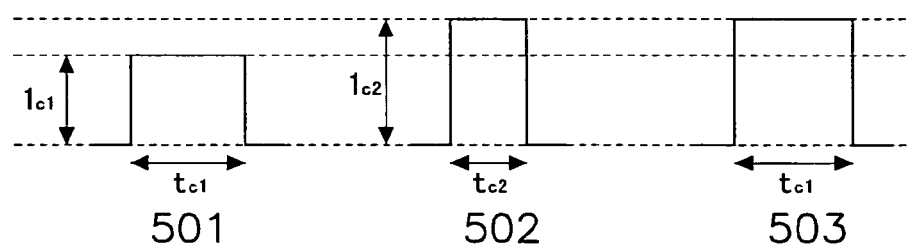
FIG. 11 is a diagram showing an example of recording/erasing pulse waveforms of the electrical information recording medium of the present invention.
Figure 11:
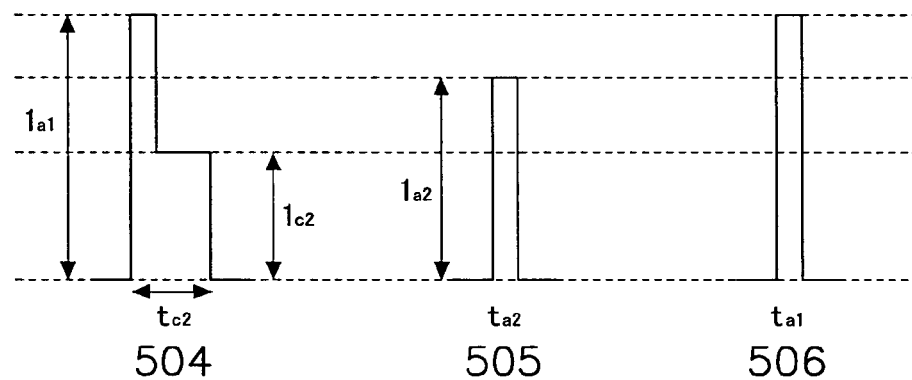
Figure 11:
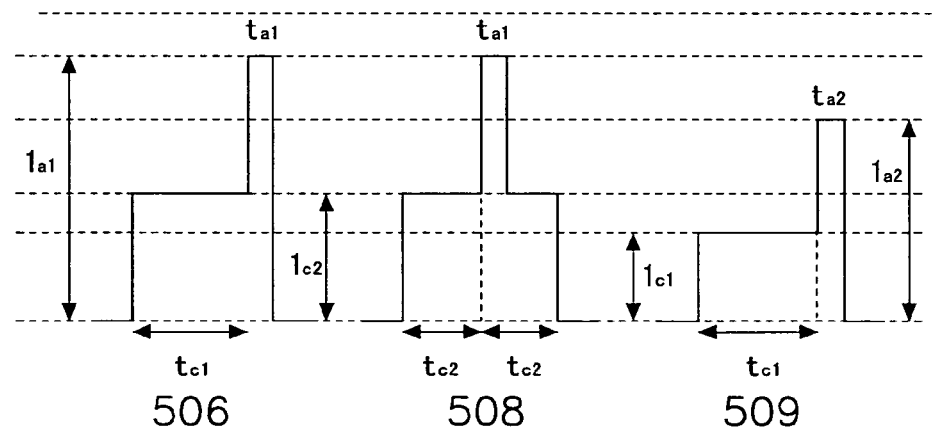
Figure 12:
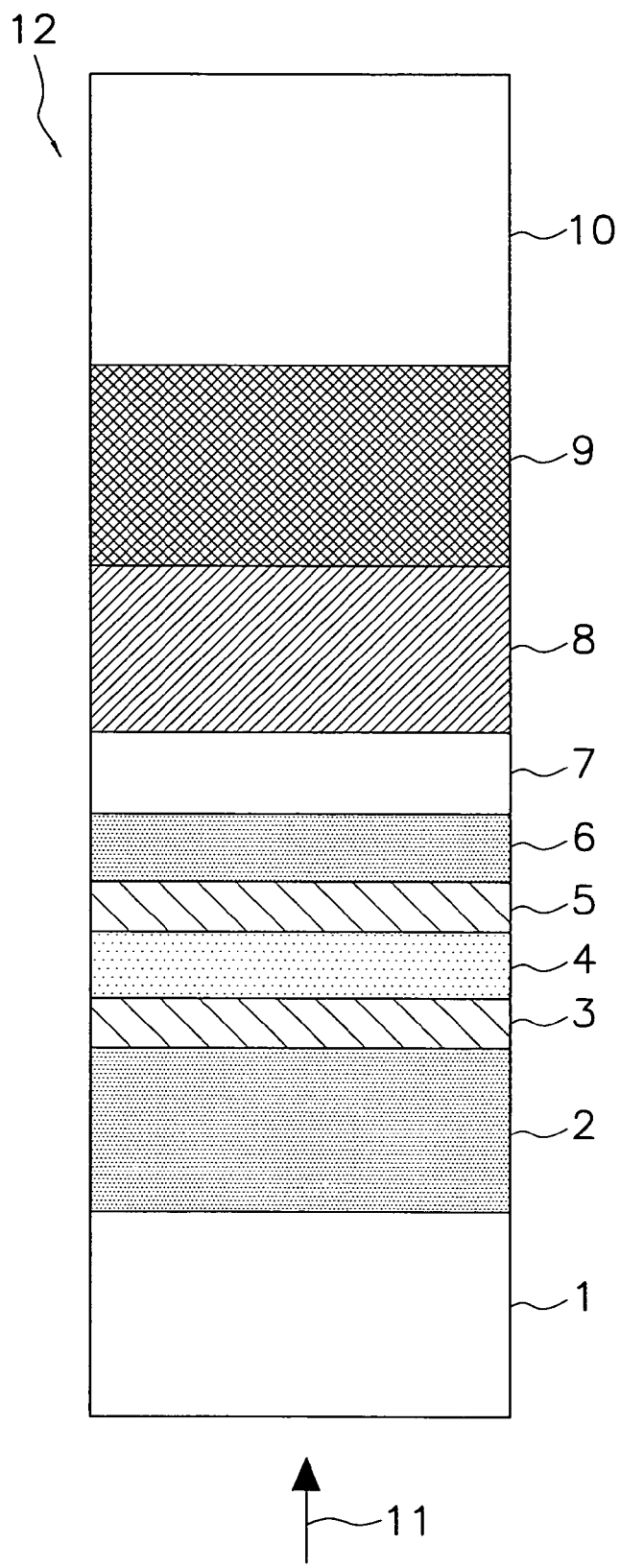
FIG. 12 is a partial cross-sectional diagram showing an example of a layer structure of a 4.7 GB/DVD-RAM.

Furthermore, in either Status 2 or Status 3, when an electrical current pulse of $I_{c2}$=10 mA and $t_{c1}$=150 ns in recording waveform 503 shown in FIG. 11 was applied, both first recording layer 41 and second recording layer 42 would undergo the transition from amorphous to crystalline (Status 4). In addition, in either Status 2 or Status 3, when an electrical current pulse of $I_{a1}=20$ mA, $I_{c2}=10$ mA, $t_{c1}=150$ ns and $t_{a1}=50$ ns in erasing waveform 507 shown in FIG. 11 was applied, both first recording layer 41 and second recording layer 42 would undergo the transition from crystalline to amorphous (Status 1). Moreover, in Status 2, when an electrical current pulse of $I_{a1}=20$ mA, $I_{c2}=210$ mA, $t_{c2}=100$ ns and $t_{a1}=50$ ns in recording waveform 508 shown in FIG. 11 was applied, first recording layer 41 would undergo a transition from crystalline to amorphous and second recording layer 42 would undergo a transition from amorphous to crystalline (Status 3). In addition, in Status 3, when an electrical current pulse of $I_{a2}=15$ mA, $I_{c1}=5$ mA, $t_{c1}=150$ ns and $t_{a2}=50$ ns in recording waveform 509 shown in FIG. 11 was applied, first recording layer 41 would undergo a transition from amorphous to crystalline and second recording layer 42 would undergo a transition from crystalline to amorphous (Status 2).

From the above results, in electrical phase-change information recording medium 44 of FIG. 8, first recording layer 41 and second recording layer 42 undergo electrical, reversible changes between the respective crystalline and amorphous phases, and it is known to be possible to realize four types of status (Status 1: first recording layer 41 and second recording layer 42 are both in the amorphous phase; Status 2: first recording layer 41 is in the crystalline phase and second recording layer 42 is in the amorphous phase; Status 3: first recording layer 41 is in the amorphous phase and second recording layer 42 is in the crystalline phase; Status 4: first recording layer 41 and second recording layer 42 are both in the crystalline phase).

Additionally, when the repeat overwrite capability electrical phase-change information recording medium 44 of is measured, with first dielectric layer 401 and second dielectric layer 402, it is known that there can be an approximately $\geq 10$-fold increase compared to the case where the dielectric layers are absent. Here, first dielectric layer 401 and second dielectric layer 402 act to suppress mass transfer from lower electrode 40 and from upper electrode 43 to first recording layer 41 and to second recording layer 42.

INDUSTRIAL APPLICABILITY

The information recording media of the present invention possess qualities for the long-term storage of data (non-volatile), and are useful for high-density overwritable-type or one write-type optical disks and the like. This invention is also suitable for application to non-volatile electrical memory.

The invention claimed is:

1. An information recording medium comprising at least a recording layer that records and/or reproduces information through irradiation with a laser beam or application of an electric current, and a dielectric layer,
    wherein the dielectric layer comprises M1 (provided that M1 is at least one element selected from Sc, Gd, Dy and Yb), M2 (provided that M2 is at least one element selected from Zr, Hf and Si) and O, such that the dielectric layer is not comprised of S and is not comprised of F.

2. An information recording medium comprising at least two information layers, wherein at least one information layer comprises at least a recording layer that records and/or reproduces information through irradiation with a laser beam or application of an electric current, and a dielectric layer,
    wherein the dielectric layer comprises M1 (provided that M1 is at least one element selected from Sc, Gd, Dy and Yb), M2 (provided that M2 is at least one element selected from Zr, Hf and Si) and O, such that the dielectric layer is not comprised of S and is not comprised of F.

3. The information recording medium according to claim 1, wherein the dielectric layer further comprises M3 (provided that M3 is at least one element selected from Al, Ga, Mg, Zn, Ta, Ti, Ce, In, Sn, Te, Nb, Cr, Bi, Al, Ge, N and C).

4. The information recording medium according to claim 1, wherein the dielectric layer is represented by a composition formula $M1_aM2_bO_{100-a-b}$ (provided that $10<a<40$ and $0<b<25$ (atom %)).

5. The information recording medium according to claim 3, wherein the dielectric layer is represented by a composition formula $M1_eM2_fM3_gO_{100-e-f-g}$ (provided that $5<e<40$, $0<f<25$, $0<g<85$ and $25<e+f+g<95$ (atom %)).

6. The information recording medium according to claim 1, wherein the dielectric layer comprises $M1_2O_3$.

7. The information recording medium according to claim 1, wherein the dielectric layer is represented by $M1_2O_3$-$M2O_2$.

8. The information recording medium according to claim 6, wherein the dielectric layer further comprises D (provided that D is at least one compound selected from $Al_2O_3$, $Ga_2O_3$, MgO, ZnO, $Ta_2O_5$, $TiO_2$, $CeO_2$, $In_2O_3$, $SnO_2$, $TeO_2$, $Nb_2O_5$, $Cr_2O_3$, $Bi_2O_3$, AlN, Cr—N, Ge—N, $Si_3N_4$ and SiC).

9. The information recording medium according to claim 7, wherein the dielectric layer is represented by a composition formula $(M1_2O_3)_x(M2O_2)_{100-x}$ (provided that $20 \leq x \leq 95$ (mol %)).

10. The information recording medium according to claim 8, wherein the dielectric layer is represented by a composition formula $(M1_2O_3)_y(D)_{100-y}$ (provided that $20 \leq y \leq 95$ (mol %)).

11. The information recording medium according to claim 8, wherein the dielectric layer is represented by a compositional formula $(M1_2O_3)_z(M2O_2)_w(D)_{100-z-w}$ (provided that $20 \leq z \leq 90$, $5 \leq w \leq 75$ and $25 \leq z+w \leq 95$ (mol %)).

12. The information recording medium according to claim 1, wherein the recording layer goes through a phase-change between a crystalline phase and an amorphous phase.

13. The information recording medium according to claim 12, wherein the recording layer comprises Ge, Te, and at least one element selected from Sb, Bi, In and Sn.

14. The information recording medium according to claim 13, wherein the recording layer is represented by any of (Ge—Sn)Te, GeTe—$Sb_2Te_3$, (Ge—Sn)Te—$Sb_2Te_3$, GeTe—$Bi_2Te_3$, (Ge—Sn)Te—$Bi_2Te_3$, GeTe—$(Sb—Bi)_2Te_3$, (Ge—Sn)Te—$(Sb—Bi)_2Te_3$, GeTe—$(Bi—In)_2Te_3$ and (Ge—Sn)Te—$(Bi—In)_2Te_3$.

15. The information recording medium according to claim 1, further comprising an interface layer between the dielectric layer and the recording layer.

16. The information recording medium according to claim 15, wherein the interface layer comprises O, at least one element selected from Zr, Hf, Y and Si, and at least one element selected from Ga, In and Cr.

17. The information recording medium according to claim 15, wherein the interface layer comprises at least one oxide selected from $ZrO_2$, $HfO_2$, $Y_2O_3$ and $SiO_2$, and at least one oxide selected from $Ga_2O_3$, $In_2O_3$ and $Cr_2O_3$.

18. The information recording medium according to claim 1, wherein M1 is Dy.

19. The information recording medium according to claim 1, wherein M1 includes Dy and the dielectric layer includes Y.

20. A method for manufacturing an information recording medium, the method comprising at least forming a recording layer and forming a dielectric layer,
    wherein a sputtering target is used in forming the dielectric layer, the dielectric layer comprising at least O, M1 (provided that M1 is at least one element selected from Sc, Gd, Dy and Yb), and M2 (provided that M2 is at least one element selected from Zr, Hf and Si), such that the dielectric layer is not comprised of S and is not comprised F.

21. A method for manufacturing an information recording medium, the method comprising forming at least two information layers, wherein at least one information layer of the at least two formed information layers includes a recording layer and a dielectric layer, and wherein a sputtering target is used in forming the dielectric layer, the dielectric layer comprising at least O, M1 (provided that M1 is at least one element selected from Sc, Gd, Dy and Yb), and M2 (provided that M2 is at least one element selected from Zr, Hf and Si), such that the dielectric layer is not comprised of S and is not comprised F.

22. The method for manufacturing an information recording medium according to claim 20, wherein the sputtering target used in forming the dielectric layer further comprises M3 (provided that M3 is at least one element selected from Al, Ga, Mg, Zn, Ta, Ti, Ce, In, Sn, Te, Nb, Cr, Bi, Al, Ge, N and C).

23. The method for manufacturing an information recording medium according to claim 20, wherein the sputtering target used in forming the dielectric layer is represented by a composition formula $M1_h M2_i O_{100-h-i}$ (provided that $5<h<45$ and $0<i<30$ (atom %)).

24. The method for manufacturing an information recording medium according to claim 22, wherein the sputtering target used in forming the dielectric layer is represented by a composition formula $M1_l M2_m M3_n O_{100-l-m-n}$ (provided that $0<l<45$, $0<m<30$, $0<n<90$ and $20<l+m+n<100$ (atom %)).

25. The method for manufacturing an information recording medium according to claim 20, wherein the sputtering target used in forming the dielectric layer comprises $M1_2O_3$.

26. The method for manufacturing an information recording medium according to claim 20, wherein a composition of the sputtering target used in forming the dielectric layer is represented by $M1_2O_3$-$M2O_2$.

27. The method for manufacturing an information recording medium according to claim 25, wherein the sputtering target used in forming the dielectric layer further comprises D (provided that D is at least one compound selected from $Al_2O_3$, $Ga_2O_3$, MgO, ZnO, $Ta_2O_5$, $TiO_2$, $CeO_2$, $In_2O_3$, $SnO_2$, $TeO_2$, $Nb_2O_5$, $Cr_2O_3$, $Bi_2O_3$, AlN, Cr—N, Ge—N, $Si_3N_4$ and SiC).

28. The method for manufacturing an information recording medium according to claim 26, wherein the sputtering target used in forming the dielectric layer is represented by a composition formula $(M1_2O_3)_s(M2O_2)_{100-s}$ (provided that $15 \leq s < 100$ (mol %)).

29. The method for manufacturing an information recording medium according to claim 27, wherein the sputtering target used in forming the dielectric layer is represented by a composition formula $(M1_2O_3)_t(D)_{100-t}$ (provided that $15 \leq t < 100$ (mol %)).

30. The method for manufacturing an information recording medium according to claim 27, wherein the sputtering target used in forming the dielectric layer is represented by a composition formula $(M1_2O_3)_u(M2O_2)_v(D)_{100-u-v}$ (provided that $15 \leq u \leq 95$, $0 < v \leq 80$ and $15 < u+v < 100$ (mol %)).

31. The method for manufacturing an information recording medium according to claim 20, wherein the method further comprises forming an interface layer between the forming of the recording layer and the forming of the dielectric layer.

32. The method for manufacturing an information recording medium according to claim 20, wherein either Ar gas is used or a gas mixture of Ar gas and $O_2$ gas is used when forming the dielectric layer.

* * * * *